(12) United States Patent
Geaghan

(10) Patent No.: US 8,174,273 B2
(45) Date of Patent: May 8, 2012

(54) CAPACITANCE MEASUREMENT CIRCUIT WITH DYNAMIC FEEDBACK

(75) Inventor: Bernard O. Geaghan, Salem, NH (US)

(73) Assignee: 3M Innovative Properties Company, Saint Paul, MN (US)

( * ) Notice: Subject to any disclaimer, the term of this patent is extended or adjusted under 35 U.S.C. 154(b) by 324 days.

(21) Appl. No.: 12/683,700

(22) Filed: Jan. 7, 2010

(65) Prior Publication Data

US 2011/0163766 A1   Jul. 7, 2011

(51) Int. Cl.
*G01R 27/26* (2006.01)
(52) U.S. Cl. ......................................... 324/678; 324/679
(58) Field of Classification Search ................... 324/678, 324/679, 683
See application file for complete search history.

(56) References Cited

U.S. PATENT DOCUMENTS

| | | | |
|---|---|---|---|
| 4,293,734 A | | 10/1981 | Pepper, Jr. |
| 4,459,541 A | * | 7/1984 | Fielden et al. ................ 324/678 |
| 6,466,036 B1 | | 10/2002 | Philipp |
| 7,129,714 B2 | | 10/2006 | Baxter |
| 2008/0142281 A1 | | 6/2008 | Geaghan |
| 2008/0252608 A1 | | 10/2008 | Geaghan |

OTHER PUBLICATIONS

U.S. Appl. No. 12/560,545, "Mutual Capacitance Measuring Circuits and Methods", filed Sep. 16, 2009.

* cited by examiner

*Primary Examiner* — Vincent Q. Nguyen
(74) *Attorney, Agent, or Firm* — Steven A. Bern

(57) ABSTRACT

Methods, devices, and systems that measure capacitance are disclosed. Typically, an accumulator circuit couples to the capacitance and includes an accumulator and switch(es) that charge the accumulator over a series of switch-controlled charging or discharging cycles governed by a first control signal. The accumulator circuit provides an accumulator signal based on the charge on the first accumulator. A discharge circuit couples to the accumulator circuit and includes an optional variable current device, the discharge circuit partially discharging the accumulator based on a second control signal. A control circuit, which couples to the accumulator circuit and the discharge circuit, dynamically adjusts the first and/or second control signals to keep the accumulator signal in a desired range. The dynamically adjusted control signal can be used as a measure of the capacitance. Such methods and systems may be used in capacitive touch sensing devices such as capacitive buttons and capacitive touch panels.

24 Claims, 12 Drawing Sheets

CAPACITANCE MEASUREMENT CIRCUIT WITH DYNAMIC FEEDBACK

FIELD OF THE INVENTION

This invention relates generally to capacitance measurement circuits, with particular application to systems such as capacitive touch sensing systems. The invention also relates to associated articles, systems, and methods.

BACKGROUND

Touch sensitive devices allow a user to conveniently interface with electronic systems and displays by reducing or eliminating the need for mechanical buttons, keypads, keyboards, and pointing devices. For example, a user can carry out a complicated sequence of instructions by simply touching an on-display touch screen at a location identified by an icon. In many touch sensitive devices, the input is sensed when a conductive object in the sensor is capacitively coupled to a conductive touch implement such as a user's finger.

In some cases, a touch from a user's finger or other touch implement or object changes an unknown capacitance Cx on a touch plate or other touch device such as a button, switch, linear slider, or the like. By measuring the unknown capacitance Cx, one can determine the presence and location (if applicable) of the touch.

FIG. 1, which is taken from U.S. Patent Application Publication US 2008/0142281 (Geaghan), shows one embodiment of a circuit 140 for measuring the unknown capacitance Cx on a touch plate (not shown). Circuit 140 can take advantage of the parallel input/output (PIO) ports found on low cost, readily available IC chips, making the circuit 140 easy to fabricate and very cost effective. Switches S15 and S16, and comparator A1, can be provided as components within a first PIO port. Similarly, switches S17 and S18, and comparator A2, can be the components within a second PIO port. Both PIO ports can be provided on a single IC chip. Dashed box 142 contains the portions of circuit 140 that are readily available on commercial IC chips (for example, the chips available from Silicon Laboratories under the trade designation C8051F320), with the remaining circuit components being external to the IC chip. Signal accumulators C11 and C12 are shown in FIG. 1 as capacitors external to the PIO ports. C11 and C12 are preferably of nominally equal value so that signal accumulation under both charging and discharging cycles occurs under roughly similar conditions. Resistor R1 is a resistor external to the PIO ports that is used to limit the charge and discharge currents to and from the touch plate as well as any electrostatic discharge (ESD) spikes. Resistor R1 may be integrated into the sensing device that includes the plate. Resistor R2 is another resistor external to the PIO ports that can be used to provide a DC bias voltage Vb to the node N2, for example ground or another voltage as described in more detail in the '281 Geaghan publication. Cx is the plate capacitance to be measured, for example the capacitance to ground from an electrode or conductive layer in a touch sensor.

In this discussion, the threshold voltage (Vth) of comparators A1 and A2 is assumed to be about equal to Vcc/2, which is typical of low cost switching circuits, even though the circuit can operate with other thresholds. The thresholds for comparators A1 and A2 are preferably equal and of a magnitude such that the number of charging and discharging cycles required to reach the threshold provide a sufficient signal-to-noise ratio.

Measurement of Cx is performed by transferring charge to and from Cx alternately through C11 and C12. The charge transfer cycles can take place in an interlaced fashion. Table 1 below indicates an exemplary ordering of charging and discharging cycles, referred to as "Sequence A". In reference to Table 1, Step 1 resets C11 and C12 to 0 V across the series combination of the two capacitors by closing S16 and S18. In Step 2, S15 is closed and C11 and Cx are charged by a positive-going pulse (i.e., current is flowing into the plate). In Step 3, the voltage V6 is sampled to see if the voltage V3 is above the switching threshold of A2. In Step 4, S18 is closed and the charge on Cx is discharged onto C12. When C11 is transferring charge, C12 is floating (S17 and S18 are open). When charge is transferred through C12, C11 is floating. In Step 5, V5 is sampled to determine if V1 is above the switching threshold of A1. Step 2 through Step 5 can be repeated, charging C11 and Cx again, then discharging Cx through C12. Step 2 through Step 5 can be repeated until the combined voltages on C11 and C12 are charged to the threshold switching point, Vth, of comparator A1 or A2. At that point, the comparator A1 output (previously low during testing) will be high during the test period of Step 5. After a few more cycles, the comparator A2 state (normally high during testing) will also be low during Step 3. The number of charge-discharge pulses required to charge C11 and C12 to this point is approximately inversely proportional to the magnitude of Cx. FIG. 2 schematically depicts the various voltage levels during a Sequence A series of charging and discharging cycles.

TABLE 1

| | Sequence A | | | | |
|---|---|---|---|---|---|
| Component | Step 1 Reset 1 | Step 2 Charge | Step 3 Test A2 | Step 4 Discharge | Step 5 Test A1 |
| S15 | open | closed | closed | open | open |
| S16 | closed | open | open | open | open |
| S17 | open | open | open | open | open |
| S18 | closed | open | open | closed | closed |
| V1 | 0 V | Vcc | Vcc | see FIG. 2 | test if >Vth |
| V2 | see FIG. 2 | see FIG. 2 | see FIG. 2 | see FIG. 2 | see FIG. 2 |
| V3 | 0 V | see FIG. 2 | see FIG. 2 | 0 V | 0 V |
| V5 | low | high | high | ? | test for high |
| V6 | low | ? | test for low | low | low |

Step 6 is to determine Cx. Sequence A loops through Steps 2, 3, 4, and 5 until V5 goes "high". When "high" is detected in Step 5, the number of cycles of Steps 2, 3, 4 and 5 indicates the ratio of Cx to C11 and C12, which in turn can be used to determine the magnitude of Cx. V6 will go "low" shortly after V5 goes high (typically one or a few cycles if C11 and C12 are equal). The number of cycles before the V6 low transition to "low" can also be used, alternatively or in combination (e.g. averaged), with the V5 high transition to calculate the value of Cx.

Because C11 and C12 may not be perfectly equal, it can be desirable to reverse the process of Sequence A, making the previous charging path into the new discharging path, and the previous discharging path into the new charging path. This reversed sequence, referred to as "Sequence B", is set forth in Table 2. Performing charge/discharge cycles according to Sequence B occurs much like performing charge/discharge cycles under Sequence A. Establishing such mutually reversed sequences that alternate the charge/discharge cycle pathways helps to compensate for differences in magnitude between the components in those pathways, particularly the magnitudes of C11 and C12, through the cycling of residual charge onto the smaller of C11 or C12 after a reset step. While performing such a sequence reversal can be beneficial, it is not required. FIG. 2 schematically depicts the various voltage levels during a Sequence B series of charging and discharging cycles.

TABLE 2

Sequence B

| Component | Step 7 Reset 7 | Step 8 Charge | Step 9 Test A1 | Step 10 Discharge | Step 11 Test A2 |
|---|---|---|---|---|---|
| S15 | open | open | open | open | open |
| S16 | closed | open | open | closed | closed |
| S17 | open | closed | closed | open | open |
| S18 | closed | open | open | open | open |
| V1 | 0 V | see FIG. 2 | see FIG. 2 | 0 V | 0 V |
| V2 | see FIG. 2 | see FIG. 2 | see FIG. 2 | see FIG. 2 | see FIG. 2 |
| V3 | 0 V | Vcc | Vcc | see FIG. 2 | see FIG. 2 |
| V5 | low | ? | test for low | low | low |
| V6 | low | high | high | ? | test for high |

Step 12 is to determine Cx. Sequence B loops through Steps 8, 9, 10, and 11 until V6 reaches its "high" state. When V6 "high" is detected in Step 11, the number of cycles of Steps 8, 9, 10, and 11 performed to that point can be used to determine the magnitude of Cx. V5 will go "low" shortly after V6 goes high. The number of cycles before the V5 transition to "low" can also be used, alternatively or in combination (e.g. averaged), with the V6 high transition to calculate the value of Cx.

Optionally, the results of determining Cx in Steps 6 and 12 can be averaged to yield a final result for Cx. The results of performing multiple A sequences and B sequences may be averaged to yield a better filtered final result for Cx.

BRIEF SUMMARY

We have developed a capacitance measurement technique suitable for use in capacitively coupled touch devices, which technique may use, in some embodiments, many of the components described above in connection with FIGS. 1 and 2. This technique makes use of an optional variable current device and a feedback mechanism to maintain a charge on at least a first accumulator in a desired range. A control signal used as a feedback (e.g. to drive the variable current device) to satisfy this condition can be used as a measure of the capacitance. Advantageously, at least some of the disclosed embodiments involve low cost, low power capacitance measuring circuits made from standard PIO ports, with a few external passive components.

The present application therefore discloses, inter alia, methods of measuring a capacitance that may include building up charge on a first accumulator over a plurality of switch-controlled charging or discharging cycles governed by a first control signal. The first accumulator may be partially discharged as a function of a second control signal, using an optional variable current device. The method may also include monitoring an accumulator signal that is based on the charge on the first accumulator, and dynamically adjusting one of the first and second control signals so as to keep the accumulator signal in a desired range. The dynamically adjusted control signal may be used as a measure of the capacitance.

In some cases the charge may be built up on the first accumulator over a plurality of switch-controlled charging cycles, and the method may then further include building up charge on a second accumulator over a plurality of switch-controlled discharging cycles, and partially discharging the second accumulator as a function of the second control signal, using the variable current device. The accumulator signal in such cases is based on the charge on the first accumulator and the charge on the second accumulator. Each charging cycle of the plurality of switch-controlled charging cycles may include a first charging interval and a first holding interval, and each charging cycle of the plurality of switch-controlled discharging cycles may include a second charging interval and a second holding interval, and the first holding interval may occur during the second charging interval, and the second holding interval may occur during the first charging interval.

In some cases, the first control signal may be maintained at a constant frequency and the second control signal may be dynamically adjusted. In other cases, the second control signal may be maintained at a constant frequency and the first control signal may be dynamically adjusted.

In some cases, the variable current device may include at least one passive circuit component and at least one switch, and the second control signal may modulate the switch to carry out the partial discharging. The switch-controlled charging or discharging cycles may be asynchronous with respect to the second control signal modulation. The second control signal may, for example, modulate the switch between a plurality of switch states, one of the switch states corresponding to an open circuit between terminals of the variable current device.

In some cases, the variable current device may include at least a first and second passive circuit component and at least one switch, and the second control signal may control the switch between a first state, in which at least the first passive circuit component passes electrical current associated with the partial discharging, and a second state, in which at least the second passive circuit component passes electrical current associated with the partial discharging. The first passive circuit component may not pass any electrical current associated with the partial discharging when the switch is in the second state.

In some cases, the dynamic adjusting may include pulse width modulating the first or second control signal, and the pulse width may be used as a measure of the capacitance.

In some cases, the capacitance may be a first capacitance associated with a touch and a first node of a touch panel, the touch also being associated with a second capacitance at a second node of the touch panel. The method may then further include measuring the second capacitance, and determining a location of the touch on the touch panel based on the measured first capacitance and the measured second capacitance.

The application also discloses various devices for measuring capacitance. For example, a device may include an accumulator circuit coupleable to the capacitance and including a first accumulator and one or more switches configured to build up charge on the first accumulator over a plurality of switch-controlled charging or discharging cycles governed by a first control signal coupled to the one or more switches, the accumulator circuit adapted to provide an accumulator signal based on the charge on the first accumulator. The device may also include a discharge circuit that is coupled to the accumulator circuit and that may include a variable current device, the discharge circuit being adapted to partially discharge the first accumulator as a function of a second control signal. The device may also include a control circuit coupled to the accumulator circuit and to the discharge circuit, the control circuit being adapted to dynamically adjust one of the first and second control signals so as to keep the accumulator signal in a desired range. The device may then use the dynamically adjusted control signal as a measure of the capacitance.

The accumulator circuit may also include a second accumulator, wherein the one or more switches are configured to build up charge on the first accumulator over a plurality of switch-controlled charging cycles and configured to build up charge on the second accumulator over a plurality of switch-controlled discharging cycles. The discharge circuit may then be further configured to partially discharge the second accumulator as a function of the second control signal. The accumulator signal may also then be based on both the charge on the first accumulator and the charge on the second accumulator.

The control circuit may be adapted to maintain the first control signal at a constant frequency and to dynamically adjust the second control signal. Alternatively, the control circuit may be adapted to maintain the second control signal at a constant frequency and to dynamically adjust the first control signal.

The variable current device may include a first passive circuit component and a first switch, and the first switch may be configured to respond to the second control signal to carry out the partial discharging. The first switch may be modulated by the second control signal between a plurality of switch states, one of the switch states corresponding to an open circuit between terminals of the variable current device.

In some cases, the variable current device may include a first and second passive circuit component and a first switch, and the second control signal may be adapted to control the first switch between a first state, in which at least the first passive circuit component passes electrical current associated with the partial discharging, and a second state, in which at least the second passive circuit component passes electrical current associated with the partial discharging. The first passive circuit component may not pass any electrical current associated with the partial discharging when the switch is in the second state.

In some cases, the control circuit may be adapted to dynamic adjust one of the first and second control signals using pulse width modulation.

In some cases, the accumulator circuit may be directly coupled to the capacitance, e.g., without any switching elements therebetween.

We also disclose capacitive touch panel devices that may include such capacitance-measuring devices.

Related methods, systems, and articles are also discussed.

These and other aspects of the present application will be apparent from the detailed description below. In no event, however, should the above summaries be construed as limitations on the claimed subject matter, which subject matter is defined solely by the attached claims, as may be amended during prosecution.

BRIEF DESCRIPTION OF THE DRAWINGS

FIG. 5b is an expanded view of a portion of the voltage versus time graph of FIG. 5a;

In the figures, like reference numerals designate like elements.

DETAILED DESCRIPTION OF ILLUSTRATIVE EMBODIMENTS

Figure 1:
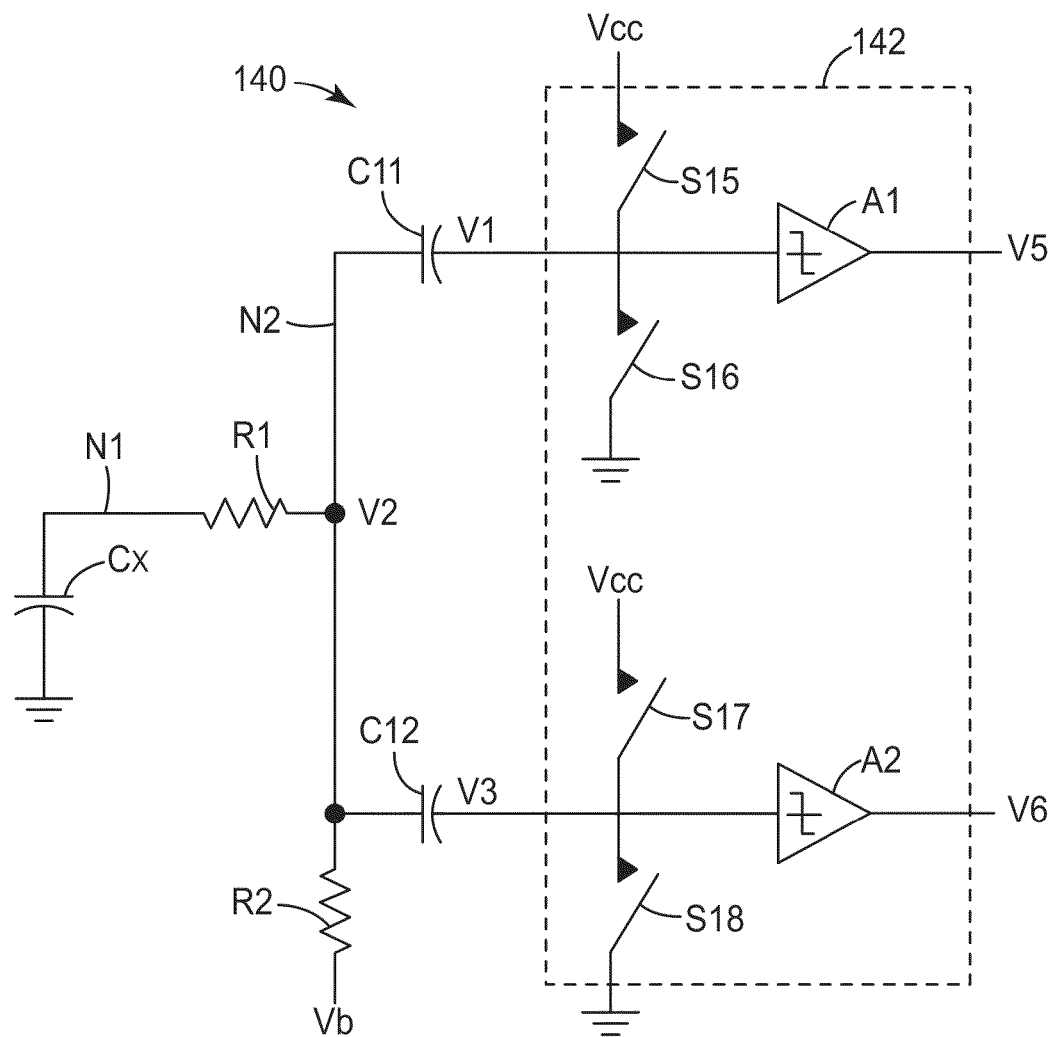
FIG. 1 is a schematic circuit diagram of a PRIOR ART capacitive sensing circuit.
Figure 2:
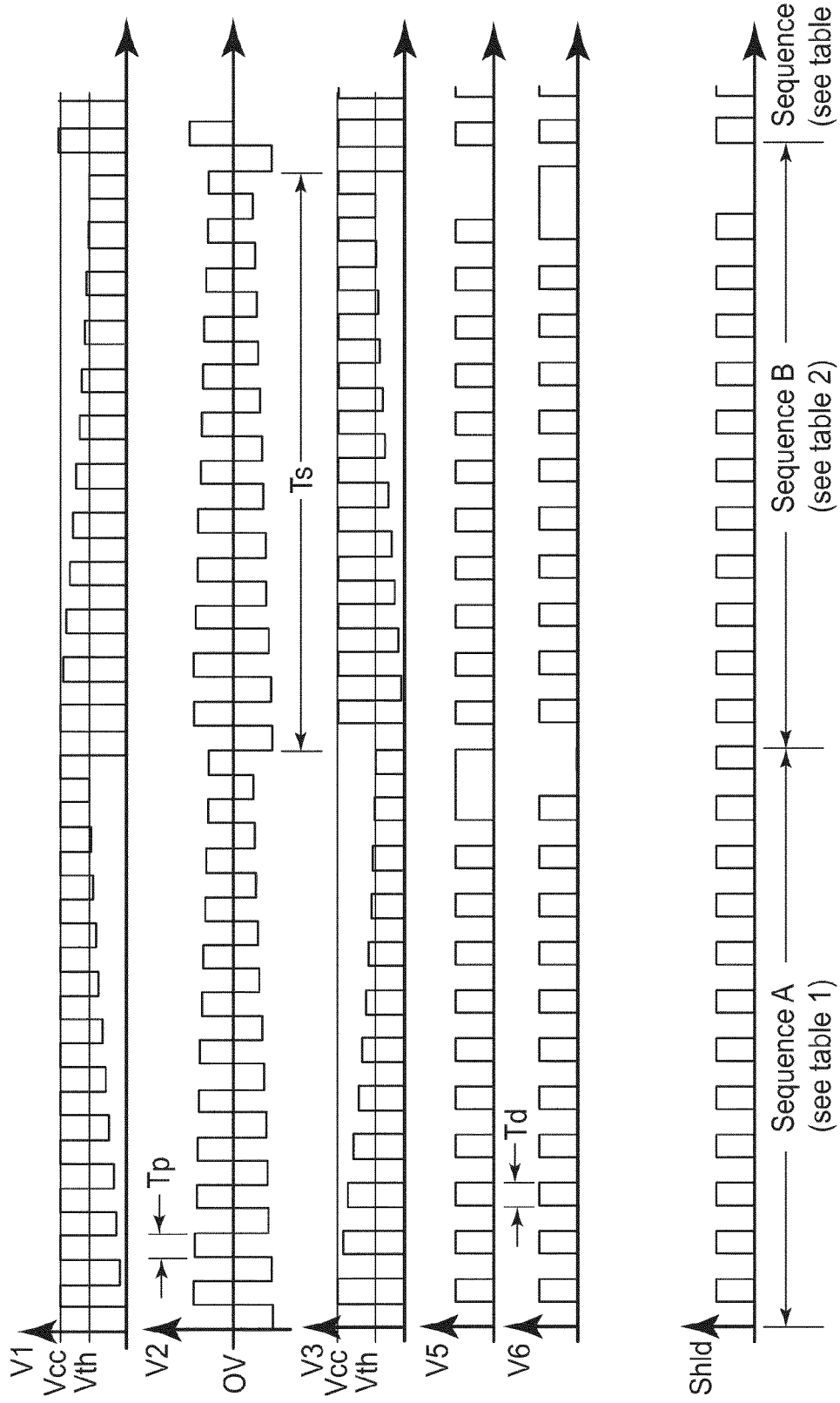
FIG. 2 is a PRIOR ART timing diagram showing various applied voltage levels over different sequences of cycles that can be performed during capacitance measurement using capacitive sensing circuits.
Figure 3:
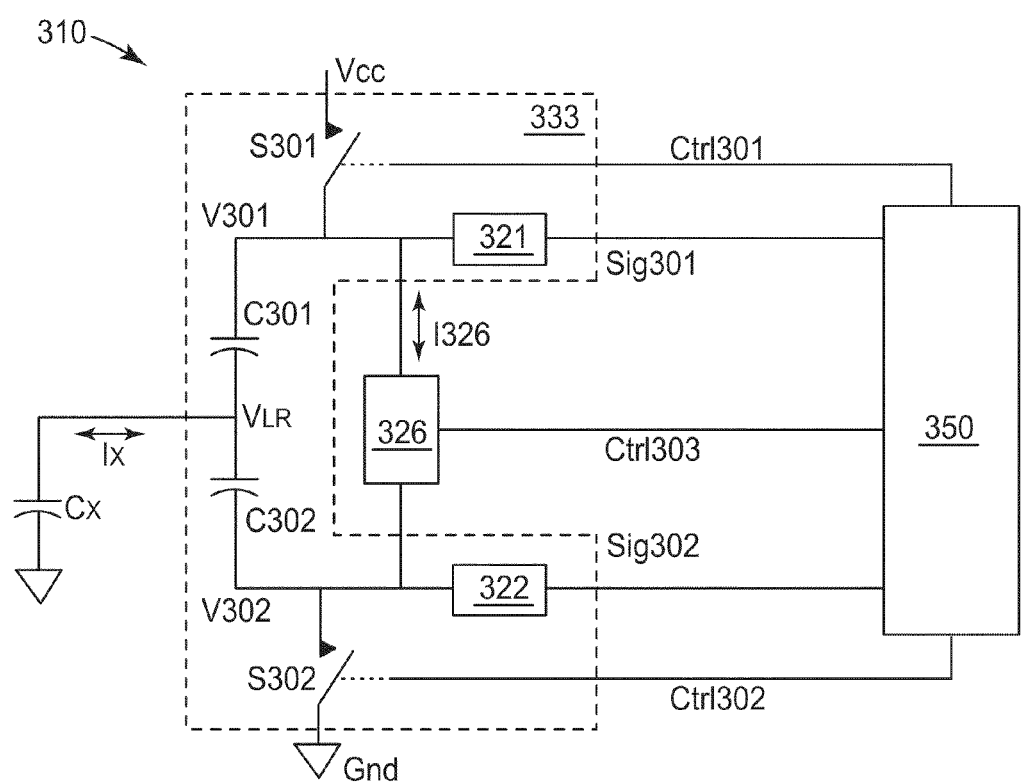
FIG. 3 is a schematic circuit diagram of a capacitive sensing circuit that uses variable current feedback control.

FIG. 3 is a schematic circuit diagram of an exemplary capacitive sensing circuit 310 that uses variable current feedback control to measure an unknown capacitance Cx. In this circuit, the capacitance Cx may be a capacitance on a touch plate or other touch device such as a button, switch, linear slider, or the like, for which a touch from a user's finger or other touch implement or object may change the value of Cx. By measuring the unknown capacitance Cx, one can determine the presence and location (if applicable) of the touch.

The circuit 310 includes an accumulator circuit 333, a discharge circuit 326, and a control circuit 350. The reader will understand that this subdivision or arrangement of the circuit 310 into distinct parts is provided for descriptive convenience, but that these subdivisions are not intended to be limiting, and other subdivisions or arrangements can also be used (including no subdivisions or arrangements) without loss of generality. Preferably, the circuit 310 directly couples to the unknown capacitance Cx, rather than coupling to it through one or more switches, for example, although one or more such coupling switches may be used in alternative embodiments. The unknown capacitance Cx may be provided by a typical surface capacitive sensor such as a 3M™ MicroTouch™ ClearTek™ capacitive touchscreen, for example, or an alternative surface capacitive sensor.

In the figure, C301 and C302 may represent external capacitors, typically of substantially equal value. Switches S301, S302 are typically FET switches, which may be incorporated into logic circuits such as tri-state drivers or parallel input/output (PIO) ports. These switches may be controlled or governed by control circuit 350 over lines Ctrl301, Ctrl302 respectively. Measurement circuits 321, 322 may be or comprise voltage comparators, or simple logic gates that measure a voltage threshold, for example. Discharge circuit 326 is or includes a variable-current circuit that operates to discharge C301 and C302 at a controlled rate, dependent on the signal Ctrl303 provided by the control circuit 350.

The accumulator circuit 333 uses the two integrating capacitors (each of which may be considered to be an "accumulator") C301, C302 in series, with capacitor C301 integrating a half cycle of AC current flowing into the unknown capacitance, and capacitor C302 integrating the opposite half cycle of AC current flowing out of the unknown capacitance. Thus, charge is built up on the capacitor C301 over a plurality of switch-controlled charging cycles, and charge is built up on the capacitor C302 over a plurality of switch-controlled discharging cycles. The voltage across the two capacitors C301, C302 can be measured during integrator-charging times when the capacitors are connected to a reference voltage.

Significantly, the circuit 310 includes feedback control that can maintain a voltage across the accumulators or capacitors C301 and C302 within a desired range, e.g., at a selected fixed level.

Thus, circuit 310 performs two relatively independent functions at overlapping times, e.g. simultaneously. In one function, accumulator circuit 333 alternatively charges the integrating capacitors C301, C302 by alternately closing switches S301 and S302, respectively. The switches S301, S302 may be controlled by one or more control signals (not shown) provided by control circuit 350. The rate of charging of C301 and C302 is dependent on the value of the capacitance Cx (and any other impedance that may be associated therewith). In the other function of circuit 310, the integrating capacitors C301, C302 are discharged slowly through discharge circuit (variable current circuit) 326 at a controlled rate.

The voltage on the series combination of C301 and C302, i.e., (V301−V302), can be measured by circuit 321 and/or circuit 322, and monitored by control circuit 350 via output signals Sig301, Sig302 from measurement circuits 321, 322 respectively. When switch S302 is closed and switch S301 is open, V302=0 so that V301 equals the voltage on the series combination of C301 and C302. When switch S301 is closed and switch S302 is open, V302 equals the supply voltage Vcc minus the voltage on the series combination of C301 and C302.

The control circuit 350 may control the voltage difference (V301−V302) to a desired range, e.g. to a nominally constant voltage, by a feedback process whereby: (1) capacitors C301 and C302 are alternately, incrementally charged by the fluctuating current Ix via the operation of switches S301, S302; (2) measurement circuits 321 and/or 322 measure the voltage on capacitors C301 and C302, and (3) the control circuit 350 dynamically adjusts the discharge current I326 in circuit 326 via control signal Ctrl303 to discharge C301 and C302 at an average rate equal to the average charging current Ix. In this way, the circuit 310 balances the charging of capacitors C301, C302 via accumulator circuit 333 with the discharging of the same capacitors via discharge circuit 326. By balancing the average charging and discharging rates, a substantially constant value of the voltage (V301−V302), and a substantially constant charge on the capacitors C301 and C302, is maintained. The control signal Ctrl303 that is required to achieve this balance can then be used as a dynamic measure or indication of the unknown capacitance Cx.

Alternatively or in addition, the control circuit 350 may control the voltage difference V301−V302 to a desired range, e.g. to a nominally constant voltage, by a feedback process whereby: (1) capacitors C301 and C302 are alternately, incrementally charged by the fluctuating current Ix via the operation of switches S301, S302; (2) measurement circuits 321 and/or 322 measure the voltage on capacitors C301 and C302, and (3) the control circuit 350 adjusts the charging current Ix via dynamic control of the switches S301, S302 to an average rate equal to the average discharging rate provided by circuit 326 (and controlled by control signal Ctrl303), where the discharging rate may either be fixed or variable as desired. In either case, the circuit 310 again balances the charging of capacitors C301, C302 via accumulator circuit 333 with the discharging of the same capacitors via discharge circuit 326. By balancing the charging and discharging, a substantially constant value of the voltage (V301−V302) is maintained. The control signal that controls the operation of switches S301, S302 to achieve this balance can then be used as a dynamic measure of the unknown capacitance Cx.

In some cases, the discharge circuit 326 need not be connected between the positive terminal of C301 and the negative terminal of C302 as is shown in the figure. For example, if V301 and V302 are controlled at a constant DC voltage with minimal AC component, then circuit 326 can discharge C301 and C302 by bleeding current to ground potential, or to a non-zero voltage potential, rather than bleeding current from a positive terminal of C301 to a negative terminal of C302. For example, the voltage differential (V301−V302) can be measured periodically via circuit 321 and/or 322 as described above, and if (V301−V302) exceeds a threshold, e.g. a threshold of circuit 321, then Ctrl303 can be adjusted to increase the discharge current I326 through circuit 326 so that (V301−V302) is reduced. The current I326 required to maintain (V301−V302) at a constant voltage is proportional to the charging current Ix, which is proportional to Cx, or more precisely with the impedance associated with the unknown capacitance Cx. An incremental change in Cx due to a touch on the touch screen, button, or the like will result in a proportional incremental change in Ix. The feedback mechanism just described will then result in a corresponding incremental change in the discharge current I326.

Table 3 below sets forth one possible sequence of operations, including switch closures, that will perform a relative capacitance-to-ground measurement in one possible embodiment of the circuit 310. This sequence assumes that the switches S301, S302 are operated or controlled at a fixed frequency and duty cycle.

TABLE 3

Sequence with Feedback

| | Step 1 | Step 2 | Step 3 | Step 4 | Step 5 | Step 6 | Step 7 |
|---|---|---|---|---|---|---|---|
| Function | Reset | $V_{LR}$ up | Test V302 | Float 1 | $V_{LR}$ down | Test V301 | Float 2 |
| S301 | open | closes | closed | opens | open | open | open |
| S302 | open | open | open | open | closes | closed | opens |
| Circuit 326 | I326 = preset current or impedance | | Is V302 below theshold Vth322? | If V302 < Vth322, increase I326, else maintain I326 | | Is V301 below threshold Vth321? | If V301 > Vth321, increase I326, else maintain I326 |

In the table, Vth321 refers to the voltage threshold of circuit 321, and Vth322 refers to the voltage threshold for circuit 322. The current I326 can be controlled by testing V302, or V301, or any combination thereof (for example, both V301 and V302, or the voltage difference between V301 and V302).

In Step 1, a reset is performed during initial power-up of the circuits, and it may also be performed periodically during operation. This reset step is optional, not required for general circuit operation. The reset step discharges the capacitors C301 and C302 by allowing current to flow through circuit 326. Depending on the design of the variable current circuit 326, discharging of the capacitors may be characterized by an exponentially decaying current flowing through a given preset impedance of the circuit 326, or it may be characterized by a constant current flowing through the circuit 326. Preferably, during startup of the circuit 310, the initial amount of current I326 allowed to flow through the circuit 326 is selected to be less than the amount of charging current Ix, so that charge and voltage can build up on the integrating capacitors C301, C302 to desired equilibrium levels.

In Step 2, switch S302 remains open, and switch S301 closes. Current flows through capacitor C301 into the unknown capacitance Cx. The voltage $V_{LR}$ steps upward, i.e., it increases incrementally.

In Step 3, with switch S301 closed, the voltage V302 may be tested to determine if the voltage V302 is above or below a predetermined threshold of measurement circuit 322.

In Step 4, switch S301 may re-open as soon as possible. The time during which S301 is closed should be just long enough for a charging current pulse to flow through C301. Typically, 2 to 5 time constants are sufficient, where the time constant is proportional to Cx, C301, and the total resistance in the path of current Ix.

After S301 opens, the current I326 may be increased or maintained, depending on the state of Sig302 as measured in Step 3. If V302 was below the threshold of circuit 322 during Step 3, then signal Ctrl303 adjusts circuit 326 to increase I326. If V302 was above the threshold of circuit 322 during Step 3, then current I326 is maintained. Note that in more sophisticated versions of the variable current circuit, the circuit may be controlled to alternatively increase, decrease, or maintain a given current level or impedance level depending on the measured value of V302.

In Step 5, switch S301 remains open, and switch S302 closes. Current flows through capacitor C302 into the unknown capacitance Cx. The voltage $V_{LR}$ steps downward, i.e., it decreases incrementally.

In Step 6, with S302 closed, the signal Sig301 may be tested to determine if the voltage V301 is above or below the threshold of measurement circuit 321.

In Step 7, switch S302 may re-open as soon as possible. The time during which S302 is closed should be just long enough for a charging current pulse to flow through C302. Typically, 2 to 5 time constants are sufficient, where the time constant is proportional to Cx, C302, and the total resistance in the path of current Ix.

After S302 opens, the current I326 may be increased or maintained, depending on the state of Sig301 as measured in Step 6. If V301 was below the threshold of circuit 321 during Step 6, then signal Ctrl303 controls circuit 326 to maintain the current I326 at its previous level. If V301 was above the threshold of circuit 321 during Step 6, then the control signal controls circuit 326 to increase the current I326. Note that in more sophisticated versions of the variable current circuit, the circuit may be controlled to alternatively increase, decrease, or maintain a given current level or impedance level depending on the measured value of V301.

Steps 2 through 7 are repeated continuously, and the resulting discharge current I326 is proportional to the charging current Ix.

The testing in Steps 4 and 7 may be carried out in a variety of ways. In one approach, testing may be performed after N transitions of the switch S301, where N is an integer greater than 1, rather than after every switching transition. In another testing approach, if measurement circuits 321 and 322 are simple comparators, then Sig301 and Sig302 are binary signals indicating whether V301 and V302, respectively, are above or below present threshold voltages. In still another testing approach, if measurement circuits 321 and 322 are analog-to-digital converters (ADCs), then Sig301 and Sig302 are continuous (analog) signals indicating the amount V301 and V302, respectively, are above or below present thresholds. This allows: (a) faster adjustment of current I326, e.g. current I326 can be adjusted a greater amount when a larger difference signal is measured; (b) the thresholds to be set at any desired signal level, within the operating range; and (c) the thresholds to be modulated during operation. Changing the threshold of Sig301 and/or Sig302 would change the subsequent magnitude of $V_{LR}$.

The voltage difference (V301−V302) can be controlled to be within a desired range, e.g. at a nominally fixed level, using either Steps 3 and 4 or Steps 6 and 7. It is not necessary to adjust the control signal Ctrl303 at both steps 4 and 7, but there may be advantages to using both. In one embodiment, Vcc may equal 5V, and circuits 321, 322 may be comparators with a threshold voltage of 1.5V, for example. The control signal Ctrl303 adjusts the current I326 as described with respect to the sequence of Table 3. Thus under normal conditions, the difference (V301−V302) is in this case controlled to a voltage of (5V−1.5V)=3.5V by circuit 321, during Steps 6 and 7. Under transitional circumstances, i.e., before balance is achieved between the charging and discharging currents, (V301−V302) may exceed 1.5V, and it may even exceed 3.5V. This may happen at start-up of the circuit, or as a result of signal interference such as ESD, or during large and rapid changes in measured capacitance. If (V301−V302) exceeds 3.5V in this embodiment, V302 will be below Vth322 during Step 6. This indicates a large transition, and as a result, Ctrl303 may adjust I326 by a larger increment in response to the transitional situation.

The sequence of Table 3 and other processes described with respect to circuit 310 may be performed by logic that may be embedded in control circuit 350, for example, such logic monitoring signals Sig301 and Sig302 and controlling signal Ctrl303. The logic may be embodied in a microprocessor or an application specific integrated circuit (ASIC), for example.

Some touch systems include a driven shield. Where a driven shield is used, it is typically driven by a signal that is the same magnitude and phase as the sensor drive signal ($V_{LR}$ in FIG. 3). For example in an exemplary case where Vcc=5V and a control threshold equals 1.5V, $V_{LR}$=3.5V. A shield drive for this circuit may then be designed to drive with 3.5V, in phase with $V_{LR}$.

Again referring to the circuit of FIG. 3, in exemplary embodiments the capacitors C301, C302 are substantially equal, e.g., nominally the same within the tolerance band of the components, and are chosen to be much larger than the unknown capacitance Cx. For example, if Cx=1000 pf, then C301=C302=0.1 uf may be used. This relatively large (100:1) ratio between Cx and C301, C302 will result in many switch-controlled charge/discharge cycles before (V301−V302) reaches a threshold of measurement circuit 321 or 322. This in turn may ensure a good measurement resolution. A smaller ratio of C301/Cx may reduce measurement time while reducing resolution of each measurement.

Switches S301 and S302 are preferably break-before-make; i.e., S301 and S302 are preferably not closed at the same time during normal operation. If one or more switches are used in circuit 326, as described further below, it is preferable that it or they do not transition on or off at the same time that S301 and S302 are transitioning on or off.

A resistor and/or inductor may be added between $V_{LR}$ and the unknown capacitance Cx, for several reasons:
  (a) ESD susceptibility—to limit ESD current into the measurement circuit.
  (b) EMI radiation issues—the circuit may operate with pulses at high frequencies and having fast rise/fall times, so it may radiate excessively. Adding a resistor can reduce EMI by increasing R-C time constants. A resistance of 50 ohms is typical.
  (c) for EMI reasons, it may be preferable to add a series inductor instead of a resistor.

In the context of a touch panel, a resistor may be used to connect the unknown capacitance, i.e., the touch sensor, to ground. One resistor to ground may be sufficient to maintain the sensor at an average of 0 volts, though a resistor at each corner of a rectangular touch panel may be used to balance impedances of the four corners. Such a resistor may not be required in some systems. If used, the resistor should have a very high value such as 1 to 2 MΩ, for example, but this range should not be construed as limiting.

As mentioned above, a rear shield may also be added to reduce noise. Driving the shield with a voltage equal to the measurement voltages may also reduce the effective parasitic capacitance of the touch sensor, as measured at a touch plate of Cx or at the four corners of a rectangular touch panel. The shield drive signal may be a constant signal level that switches synchronously with $V_{LR}$. A constant shield drive signal could be generated from a single PIO, preferably connected to the shield through a capacitor.

Figure 4:
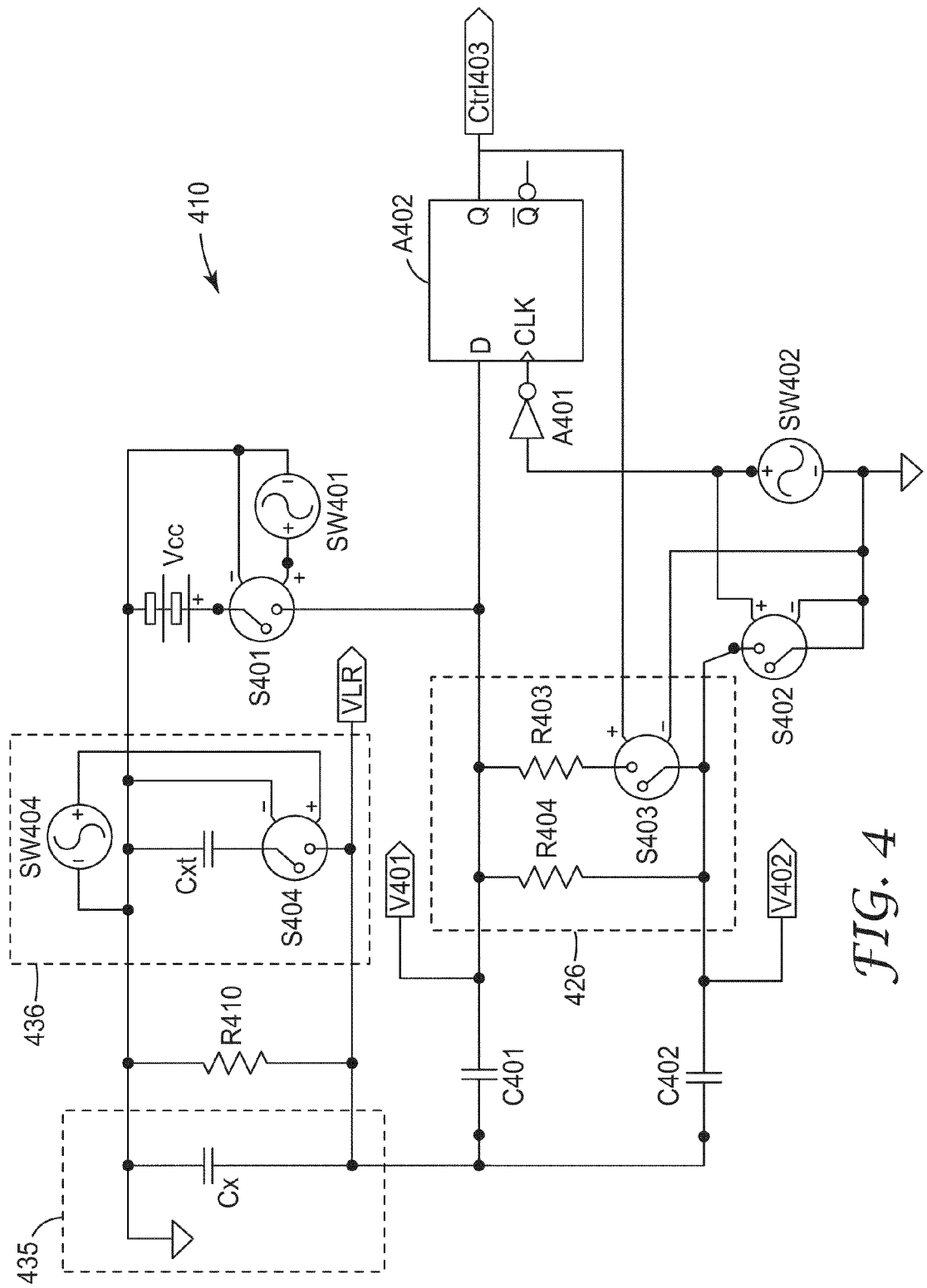
FIG. 4 is a schematic circuit diagram of another capacitive sensing circuit that uses variable current feedback control.

Turning now to FIG. 4, we see there a schematic circuit diagram of another capacitive sensing circuit 410 that uses variable current feedback control. In this circuit, the capacitance to be measured (referred to above as an unknown capacitance) is divided into a first block 435, which has a grounded capacitor Cx, and a second block 436, which has a capacitor Cxt that is switchably connected in parallel with the capacitor Cx via a switch S404 controlled by a switch control circuit SW404. By alternately closing and opening the switch S404, we simulate the effect of a touch on the unknown capacitance of a capacitively coupled touch device. Thus, when switch S404 is open, the unknown capacitance is given by simply the value of Cx. This may be characteristic of a touch device in the absence of a touch from a finger or other touch implement. When switch S404 is closed, the unknown capacitance increases to Cx+Cxt. This may be characteristic of the touch device in the presence of a touch. A resistor R410 is also connected in parallel with the capacitor Cx to more accurately approximate the impedance of an actual touch sensor on a typical touch device.

Other elements of sensing circuit 410 are analogous to corresponding elements in the circuit of FIG. 3. For example, integrating capacitors C401, C402 (each of which may be considered to be an "accumulator") correspond substantially to integrating capacitors C301, C302, respectively. Switches S401, S402, which are controlled respectively by switch control circuits SW401, SW402, correspond substantially to switches S301, S302, respectively. The block 426, which contains resistors R403, R404, and a switch S403, is one example of a discharge circuit (or variable current circuit) shown schematically as circuit 326 in FIG. 3. The nodes $V_{LR}$, V401, and V402 in FIG. 4 correspond substantially to the nodes $V_{LR}$, V301, and V302, respectively, in FIG. 3. A D-type Flip-Flop integrated circuit A402 (which may be a Fairchild model 74ACT374 device or other suitable device), optionally together with switch control circuits SW401 and SW402, can be considered to constitute a simplified embodiment of the control circuit 350 in FIG. 3. The Flip-Flop A402 has a data input "D", a clock input "CLK", and non-inverting and inverting outputs Q, $\overline{Q}$, respectively. The output Q of the Flip-Flop A402, which is labeled Ctrl403, substantially corresponds to a possible embodiment of the control line Ctrl303 in FIG. 3. In FIG. 4, the output at Ctrl403 provides a pulse-width modulated (PWM) control signal to the switch S403. Thus, by changing the width of the pulse that controls switch S403, the output Ctrl403 changes the amount of time the resistor R403 is connected in parallel with resistor R404, thus changing the impedance of (and the amount of discharge current drawn by) variable current circuit 426. The circuit 410 also includes a voltage supply source Vcc and a logic inverter A401, arranged as shown.

The operation of circuit 410 was simulated using a program marketed under the trade name "LTspice IV" available from Linear Technology Corporation of Milpitas, Calif. In the simulation, the following operating values and device types were assumed:
  Cx: 200 picofarad
  Cxt: 200 picofarad
  C401: 0.2 microfarad
  C402: 0.2 microfarad
  R403: 8 kohm
  R404: 15 kohm
  R410: 2 Megohm
  Vcc: 5 volts
  S401: integrated circuit switch type 74AHCT367 (threshold voltage 1.5 volts, "on" resistance (Ron) of 20 ohms)
  S402: (same as S401)
  S403: integrated circuit switch type 74HC4316 (threshold voltage 2.5 volts, Ron=50 ohms)
  S404: FET switch (threshold voltage 2.5 volts, Ron=5 ohms)
  A402: D-type Flip-Flop type 74ACT374 (threshold voltage for the D input is 1.5 volts)

The switch S404, the activation of which simulates the onset of a touch, was open from simulation time t=0 to t=4 milliseconds. At time t=4 milliseconds, switch S404 was closed to simulate a touch. The switches S401 and S402 were alternately closed for 2 microseconds and opened for 3 microseconds, so the switching period for these switches was 5 microseconds, yielding a base frequency of operation of 200 kHz.

Figure 5A:
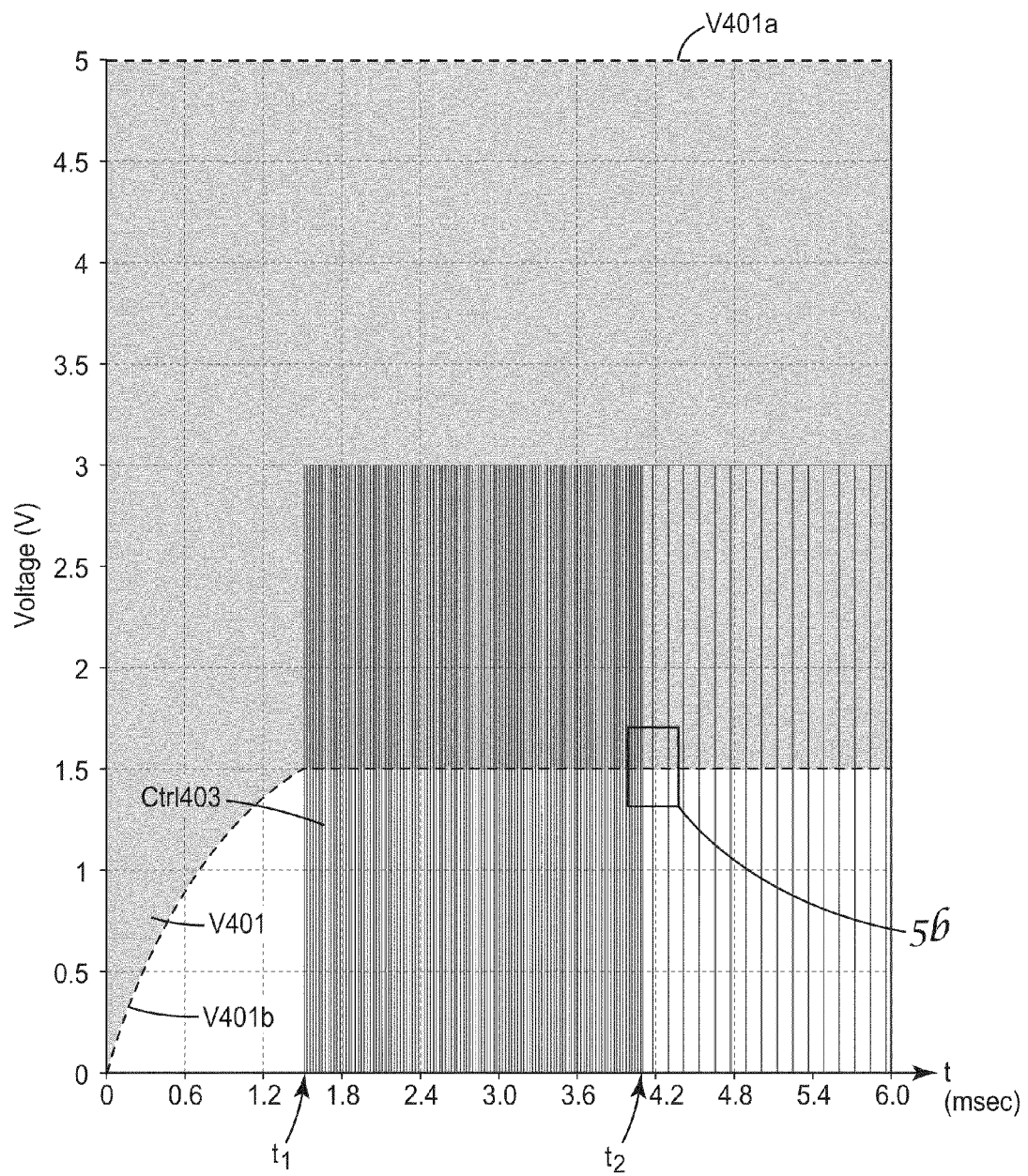
FIG. 5a is a voltage versus time graph showing the modeled response of the circuit of FIG. 4 when particular values are used for the circuit components.
Figure 5B:
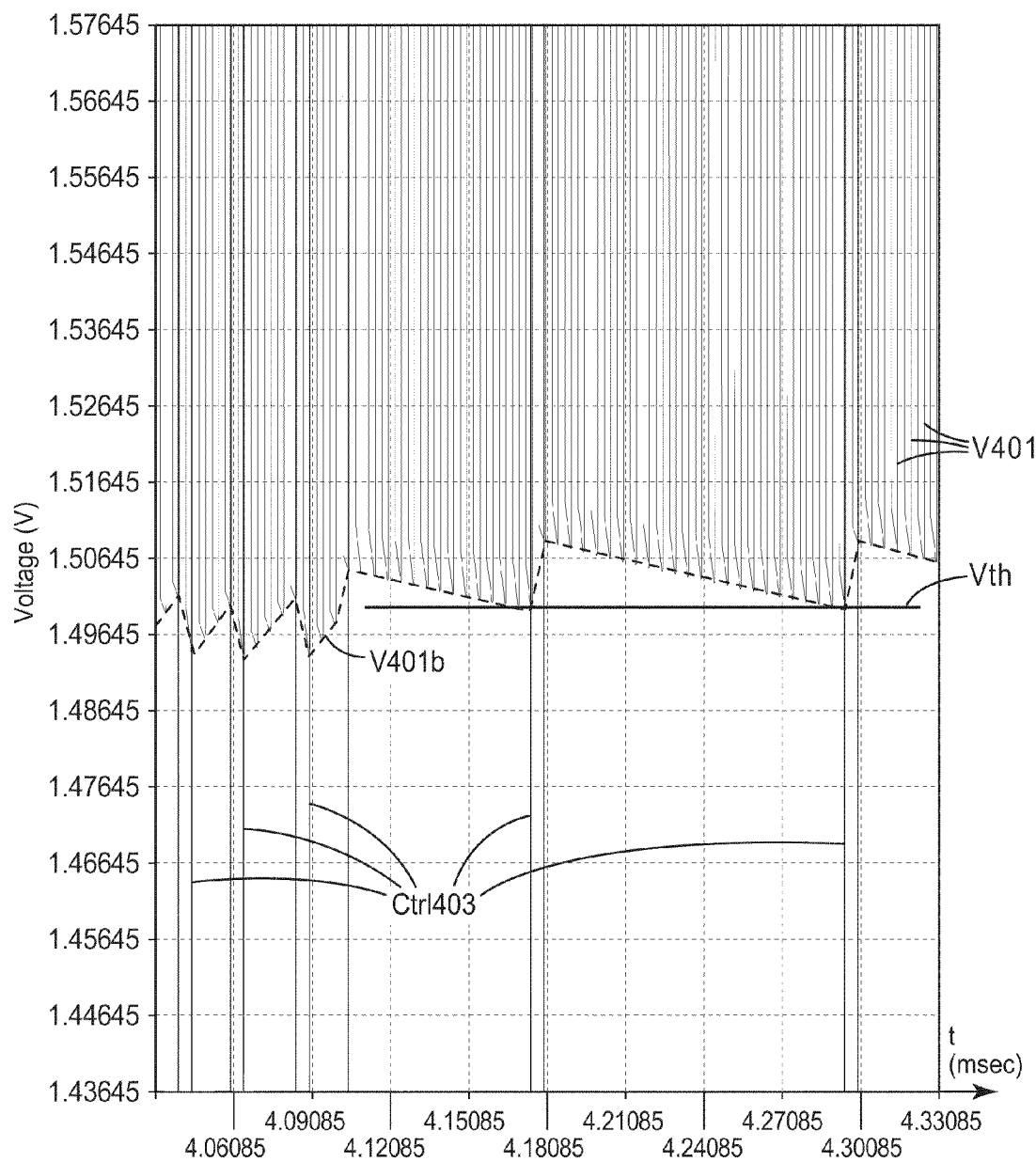

The simulated waveforms for this circuit are provided in FIGS. 5a and 5b. FIG. 5a is a voltage versus time graph showing the modeled response of the circuit of FIG. 4 when the above values are used for the circuit components. FIG. 5b is an expanded view of a portion of the voltage versus time graph of FIG. 5a.

In FIG. 5a, the labeling used for the various signals is the same as in FIG. 4. On the time scale of the figure, the V401 signal oscillates so rapidly between an upper limit V401a and a lower limit V401b that no distinct waveform can be discerned. Starting at time t=0, the lower limit of signal V401 rises as the integrating capacitors C401 and C402 are steadily charged by operation of the switches S401, S402. At time t=t1=1.5 msec, the lower limit of signal V401 reaches the threshold Vth of the device A402, and the output Q of A402 (i.e., control signal Ctrl403) changes state, closing switch S403. This adds parallel shunt resistance R403 in the variable current circuit 426 to increase the discharge current from capacitors C401 and C402, causing the lower limit of V401 to stop increasing and start decreasing. When V401 falls back below the threshold Vth of A402, the switch S403 is re-opened, and the lower limit of V401 stops decreasing and starts increasing again. As the signal V401 thereafter alternately falls above and below the threshold Vth, the control signal Ctrl403 oscillates rapidly (but not as rapidly as signal V401) between a lower limit of 0 volts and an upper limit of 3 volts. This results in a pulse-width modulated (PWM) waveform Ctrl403, the duty cycle of which is proportional to the charging rate of C401 and C402, which is proportional to the current flowing through the unknown capacitance (in this circumstance, Cx), which in turn (for a given base switching frequency) is proportional to the value of the unknown capacitance (in this circumstance, Cx).

As seen in FIG. 5a and seen more clearly in the expanded view of FIG. 5b, the presence of a touch, simulated by the closing of switch S404 at time t=t2=4 milliseconds such that the touch capacitance Cxt is added in parallel with the original capacitance Cx, causes the duty cycle of Ctrl403 to change significantly. The duty cycle of the control signal Ctrl403 can thus be used as a measure of the unknown capacitance, which in the depicted simulation equals Cx (200 picofarads) before time t=t2 and equals Cx+Cxt (400 picofarads) after time t=t2. In FIG. 5b, individual pulses of V401 can be discerned, and variations among V401 pulses can be seen near the threshold voltage Vth=1.5V. The change in duty cycle of the control signal Ctrl403 can also be readily seen.

To adjust for variations in capacitance among various touch sensors and systems, it may be desirable in some cases to change the base frequency of switches S401 and S402. The simulated example described above (FIGS. 4, 5a, 5b) uses a base frequency of 200 KHz. If the capacitance Cx of the touch sensor were 400 pf instead of 200 pf, it may be preferable to reduce the base frequency of operation to adjust the charging current through Cx to a range that more closely matches the range of discharge currents available from the variable current circuit 426.

FIGS. 6a-e are schematic circuit diagrams of various variable current devices that may be used in the disclosed capacitance measurement circuits. The reader will keep in mind that these embodiments are merely exemplary, and that other variable current devices can also be used as desired. In each case, the variable current device is shown connected between one terminal labeled V1 and another terminal labeled V2, where V1 and V2 may correspond for example to V301 and V302, respectively, in FIG. 3, or to V401 and V402, respectively, in FIG. 4, for example.

Figure 6A:
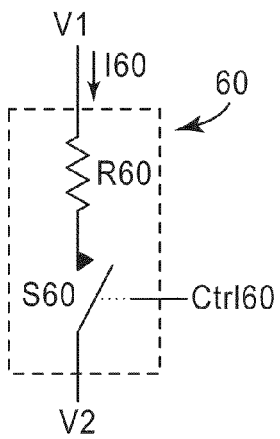
FIGS. 6a-e are schematic circuit diagrams of various variable current devices.

In FIG. 6a, a variable current device 60 comprises a resistor R60 and a switch S60 in series. Switch S60 is opened and closed using a pulse width modulation (PWM) signal on control line Ctrl60 to increase, decrease, or maintain the average value of current I60. The maximum level of I60 is approximately (V1−V2)/R60, assuming the resistance of S60 is much less than R60. The minimum level of I60 is zero, and the average value of I60 can be adjusted to any current between these levels.

Figure 6B:
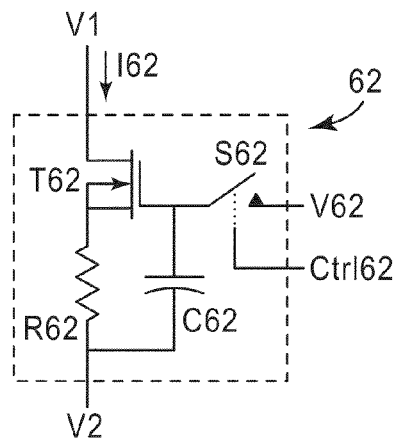

Variable current device 62 of FIG. 6b comprises a resistor R62 and a transistor T62 in series. The current through T62 is adjusted by setting the voltage on a capacitor C62, which adjusts the gate-source voltage of transistor T62. The voltage on C62 can be set by closing a switch (e.g. S302 of FIG. 3 or S402 of FIG. 4) so that V2 is at ground. Then, V62 (which may be considered to be a secondary or alternate control signal for device 62) may be set to a voltage level to be applied to C62. Switch S62 is then closed, C62 is charged to V62, then S62 is re-opened. The switch S302 of FIG. 3 or S402 of FIG. 4 preferably remains closed while switch S62 is closed. The voltage on C62, and thus also the current I62, stays relatively constant until the next refresh cycle when S62 is re-closed and V62 is re-applied to C62. The maximum level of I62 is approximately (V1−V2)/R62, assuming the resistance of T62 is much less than R62. The minimum level of I62 is zero, and I62 can be adjusted to any current between these levels.

Figure 6C:
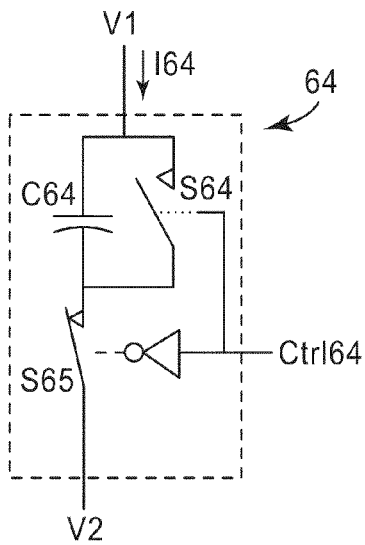
Figure 6D:
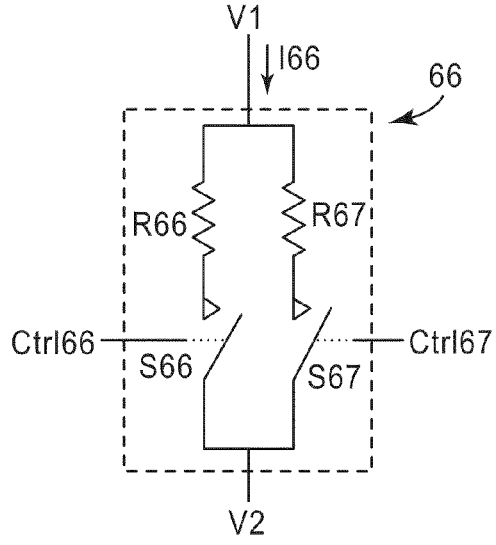

Variable current device 64 in FIG. 6c is a switched capacitor circuit comprising a capacitor C64 and switches S64 and S65. Switches S64 and S65 operate in opposite phase from one another, so when one is closed the other is open. The rate of switching of S64 and S65 is controlled by the control signal Ctrl64, which is typically a variable-frequency square wave. The average level of the discharge current I64 is directly proportional to the frequency of Ctrl60 and to the magnitude of C64.

Other variable current circuits may also be used. For example, FET T62 in FIG. 6b may be replaced by a bipolar transistor, or an optically coupled transistor or diode may be used in place of the T62 and C62 combination. Likewise, alternative switched capacitor circuits may be apparent to those skilled in the art.

Figure 6E:
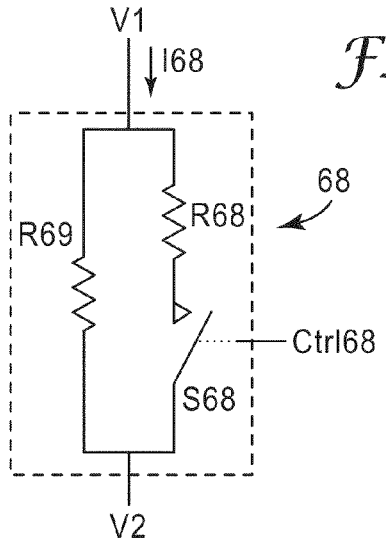

Circuits 60, 62, and 64 may be used in combination. For example, a variable current circuit may be constructed of the circuit 60 connected in parallel with the circuit 62, or two of circuits 60 may be connected in parallel, as shown in the variable current circuit 66 of FIG. 6d. The circuit 66 comprises first and second resistors R66, R67, and first and second switches S66, S67 connected as shown, with control signal Ctrl66 controlling the operation of switch S66 and control signal Ctrl67 controlling the operation of switch S67 to provide variable current I66, as shown. FIG. 6e shows another alternative variable current device 68 with a fixed resistor R69 in parallel with a resistor R68-and-switch S68 combination to provide variable current I68. The configuration of circuit 68 may be substantially the same as that of circuit 426 of FIG. 4.

The capacitive measurement circuits with feedback may also be used to measure mutual capacitance Cm, e.g., between a finger or stylus and one or more electrodes, or between two electrodes of a matrix-type touch screen. Such a screen in shown schematically in FIG. 7. Thus, the unknown capacitance to be measured, referred to above as capacitance Cx, may here be referred to as the mutual capacitance Cm.

Figure 7:
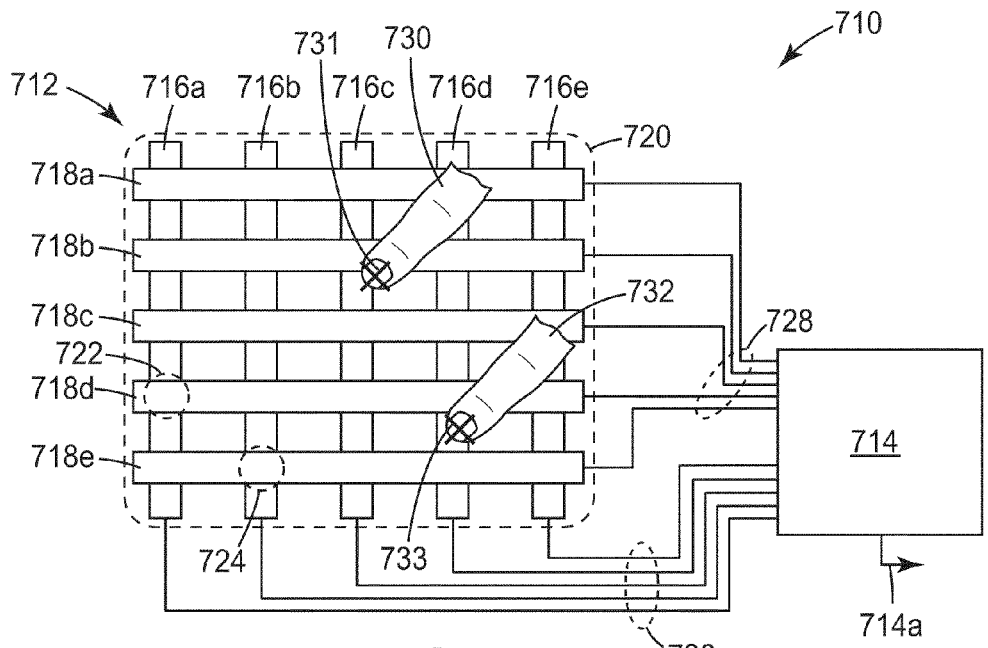
FIG. 7 is a schematic view of a touch device that operates based on the measurement of mutual capacitances between row electrodes and column electrodes, also known as drive electrodes and receive electrodes.

The exemplary touch device 710 of FIG. 7 includes a touch panel 112 connected to electronic circuitry, which for simplicity is grouped together into a single schematic box labeled 714 and referred to collectively as a controller.

The touch panel 712 is shown as having a 5×5 matrix of column electrodes 716a-e and row electrodes 718a-e, but other numbers of electrodes and other matrix sizes can also be used. The panel 712 is typically substantially transparent so that the user is able to view an object, such as the pixilated display of a computer, hand-held device, mobile phone, or other peripheral device, through the panel 712. The boundary 720 represents the viewing area of the panel 712 and also preferably the viewing area of such a display, if used. The electrodes 716a-e, 718a-e are spatially distributed, from a plan view perspective, over the viewing area 720. For ease of illustration the electrodes are shown to be wide and obtrusive, but in practice they may be relatively narrow and inconspicuous to the user. Further, they may be designed to have variable widths, e.g., an increased width in the form of a diamond- or other-shaped pad in the vicinity of the nodes of the matrix in order to increase the inter-electrode fringe field and thereby increase the effect of a touch on the electrode-to-electrode capacitive coupling. In exemplary embodiments the electrodes may be composed of indium tin oxide (ITO) or other suitable electrically conductive materials. From a depth perspective, the column electrodes may lie in a different plane than the row electrodes (from the perspective of FIG. 7, the column electrodes 716a-e lie underneath the row electrodes 718a-e) such that no significant ohmic contact is made between column and row electrodes, and so that the only significant electrical coupling between a given column electrode and a given row electrode is capacitive coupling. The matrix of electrodes typically lies beneath a cover glass, plastic film, or the like, so that the electrodes are protected from direct physical contact with a user's finger or other touch-related implement. An exposed surface of such a cover glass, film, or the like may be referred to as a touch surface.

The capacitive coupling between a given row and column electrode is primarily a function of the geometry of the electrodes in the region where the electrodes are closest together. Such regions correspond to the "nodes" of the electrode matrix, some of which are labeled in FIG. 7. For example, capacitive coupling between column electrode 716a and row electrode 718d occurs primarily at node 722, and capacitive coupling between column electrode 716b and row electrode 718e occurs primarily at node 724. The 5×5 matrix of FIG. 7 has 25 such nodes, any one of which can be addressed by controller 714 via appropriate selection of one of the control lines 726, which individually couple the respective column electrodes 716a-e to the controller, and appropriate selection of one of the control lines 728, which individually couple the respective row electrodes 718a-e to the controller.

When a finger 730 of a user or other touch implement comes into contact or near-contact with the touch surface of the device 710, as shown at touch location 731, the finger capacitively couples to the electrode matrix. The finger draws charge from the matrix, particularly from those electrodes lying closest to the touch location, and in doing so it changes the coupling capacitance between the electrodes corresponding to the nearest node(s). For example, the touch at touch location 731 lies nearest the node corresponding to electrodes 716c/718b. As described further below, this change in coupling capacitance can be detected by controller 714 and interpreted as a touch at or near the 716c/718b node. Preferably, the controller is configured to rapidly detect the change in capacitance, if any, of all of the nodes of the matrix, and is capable of analyzing the magnitudes of capacitance changes for neighboring nodes so as to accurately determine a touch location lying between nodes by interpolation. Furthermore, the controller 714 advantageously may be designed to detect multiple distinct touches applied to different portions of the touch device at the same time, or at overlapping times. Thus, for example, if another finger 732 touches the touch surface of the device 710 at touch location 733 simultaneously with the touch of finger 730, or if the respective touches at least temporally overlap, the controller is preferably capable of detecting the positions 731, 733 of both such touches and providing such locations on a touch output 714a. The number of distinct simultaneous or temporally overlapping touches capable of being detected by controller 714 is preferably not limited to 2, e.g., it may be 3, 4, or more, depending on the size of the electrode matrix.

As discussed further below, the controller 714 may employ a variety of circuit modules and components that enable it to rapidly determine the coupling capacitance at some or all of the nodes of the electrode matrix. For example, the controller may include at least one drive unit. The drive unit may deliver a drive signal to one electrode, referred to as a drive electrode. In the embodiment of FIG. 7, the column electrodes 716a-e may be used as drive electrodes, or the row electrodes 718a-e may be so used. The drive signal may, for example, be delivered to one drive electrode at a time, e.g., in a scanned sequence from a first to a last drive electrode. As each such electrode is driven, the controller monitors the other set of electrodes, referred to as receive electrodes, in order to measure the mutual capacitance between the drive electrode being energized and each of the receive electrodes being monitored. The controller 714 may include one or more sense units coupled to all of the receive electrodes. For each drive signal that is delivered to each drive electrode, the sense unit(s) generate response signals for the plurality of receive electrodes.

Figure 8:
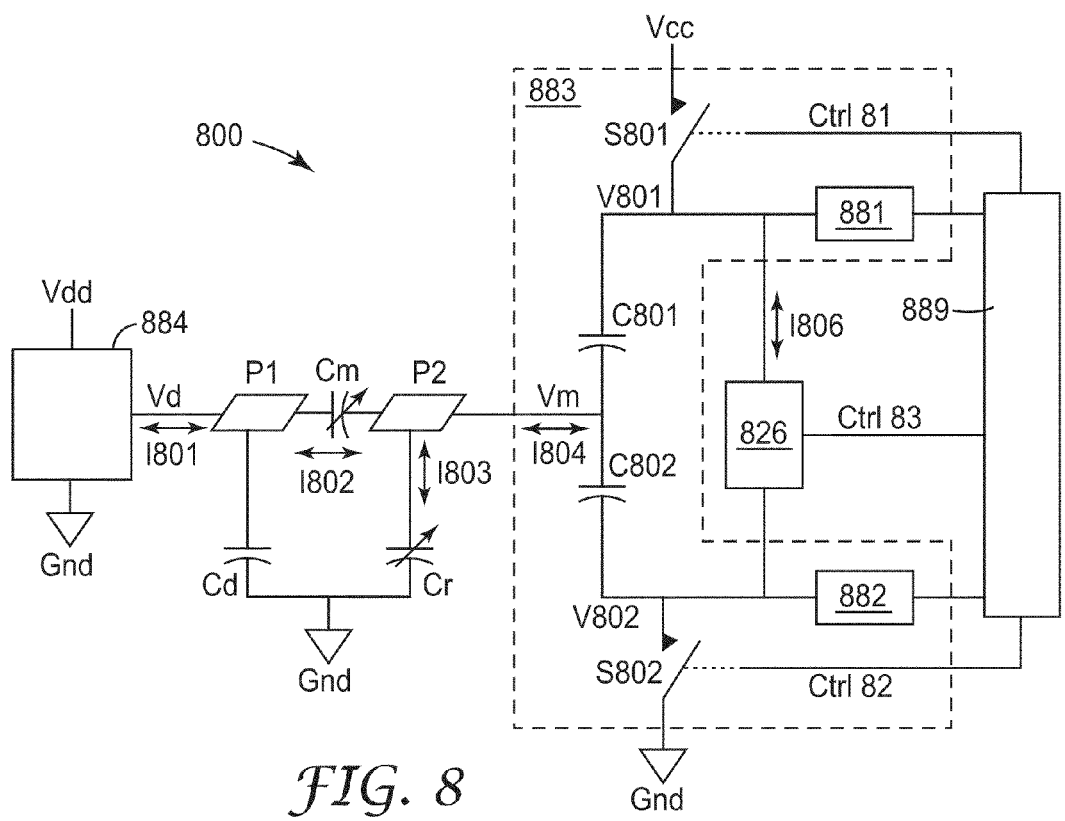
FIG. 8 is a schematic circuit diagram of a touch device in which relevant drive and detection circuitry is shown in the context of one drive electrode and one receive electrode capacitively coupled thereto.

FIG. 8 is a schematic circuit diagram of a touch device 800 in which relevant drive circuitry 884 and detection circuitry (comprising an accumulator circuit 883, a discharge circuit 826, and a control circuit 889) is shown in the context of one drive electrode P1 and one receive electrode P2 capacitively coupled thereto, in accordance with a matrix-type touch screen similar to that of FIG. 7. The touch device 800 may be used to measure mutual capacitance Cm between a stylus and one or more electrodes, or between the two electrodes P1, P2. Driver circuit 884 applies voltage pulses Vd to a stylus tip or to electrode P1. The detection circuitry, comprising accumulator circuit 883, discharge circuit 826, and control circuit 889, may be of the same or similar design to that of FIGS. 3 and 4, discussed previously. The discharge circuit 826 (which may be or comprise a variable current circuit) may be the same or similar to those described in connection with FIGS. 3, 4, and 6a-e. For further information on the measurement of mutual capacitance, reference is made to commonly assigned co-pending U.S. application Ser. No. 12/560,545, filed Sep. 16, 2009 and incorporated herein by reference.

In FIG. 8, the detection circuitry includes elements that may be the same or similar to corresponding elements of FIGS. 3 and 4, for example. Thus, integrating capacitors C801, C802 may correspond substantially to capacitors C301, C302 of FIG. 3. Switches S801, S802 may correspond substantially to switches S301, S302 of FIG. 3. Discharge circuit (or variable current circuit) 826 may correspond substantially to circuit 326 of FIG. 3. Control circuit 889 may correspond substantially to control circuit 350 of FIG. 3. Control lines 81, 82, 83 may correspond substantially to control lines Ctrl301, Ctrl302, Ctrl303, respectively, of FIG. 3. Currents I804 and I806 may correspond substantially to currents Ix and I326, respectively, of FIG. 3.

The value of the unknown capacitance Cm (FIG. 8) may be determined by applying a known voltage to Cm and measuring the resulting current I802. To accomplish this, driver circuit 884 may apply voltage pulses Vd, with a corresponding current I801, to electrode P1. The voltage Vm (at the node between integrating capacitors C801 and C802) is preferably maintained at a fixed (DC) voltage during the time Cm is being measured. Maintaining Vm fixed holds electrode P2 at a constant voltage, so that negligible current flows through Cr, i.e., I803≈0. Given I803=0, it follows that I802=I804. The current I804 is measured by accumulating charge alternately on C801 and C802 while maintaining Vm at a constant level. This may be done using the sequence shown below in Table 4, with the measurement threshold of measurement circuit 882=0V=Gnd, and/or the measurement threshold of measurement circuit 881=Vcc. The result will be that V802 is adjusted to approximately 0V and V801 will be approximately Vcc. Adjustment is done by logic in control circuit 889 which controls the discharge current I806 such that C801 and C802 are discharged at the same rate these capacitors are charged by the charge current I804.

TABLE 4

Alternative Sequence with Feedback

| | Step 1 | Step 2 | Step 3 | Step 4 | Step 5 | Step 6 | Step 7 | Step 8 | Step 9 |
|---|---|---|---|---|---|---|---|---|---|
| Function | Reset | | Vd down | Test V802 | Float 1 | | Vd up | Test V801 | Float 2 |
| S801 | open | closes | closed | closed | opens | open | open | open | open |
| S802 | open | open | open | open | open | closes | closed | closed | opens |
| Circuit 884 | Vd = high | Vd = high | Vd goes hi to low | stay low | stay low | stay low | Vd goes low to high | stay high | stay high |
| Circuit 826 | I806 = preset current or impedance | | | Is V802 below threshold Vth882? | If V802 < Vth882, increase I806, else maintain I806 | | | Is V801 below threshold Vth881? | If V801 > Vth881, increase I806, else maintain I806 |

In the table, Vth881 refers to the voltage threshold of circuit 881, which in this case equals Vcc. Vth882 refers to the voltage threshold for circuit 882, which in this case equals ground potential. The current I806 can be controlled by testing V802, or V801, or any combination thereof (for example, both V801 and V802, or the voltage difference between V801 and V802).

Conveniently, the device 800 may also be used to measure the capacitance Cr between electrode P2 and ground, or to measure any capacitance to ground. To do this, the threshold of circuit 882 is set to a non-zero value, for example 1.5V may be used with a Vcc of 5V, and a threshold for measurement circuit 881 of 1.5V may be used as discussed with respect to system 310 of FIG. 3. The sequence of Table 3 above may then be used to measure I804, which is proportional to the parallel combination of capacitances Cm and Cr. Many mutual capacitance sensors comprise a matrix with an array of horizontal parallel electrodes arranged perpendicular to an array of parallel vertical electrodes as described above in connection with FIG. 7, and in the commonly assigned co-pending U.S. application Ser. No. 12/560,545, filed Sep. 16, 2009. The capacitance Cr may represent the capacitance to ground of one electrode and Cm may be the mutual capacitance between one horizontal electrode and one vertical electrode. In this case, Cr>>Cm, so the parallel combination of Cm and Cr is nearly equal to Cr.

If the voltage Vd is driven at a voltage level equal to and in phase with the voltage Vm, then current I802 will be negligible and I804=I803, so the measured parameter I804 will be proportional to the capacitance Cr.

Figure 9:
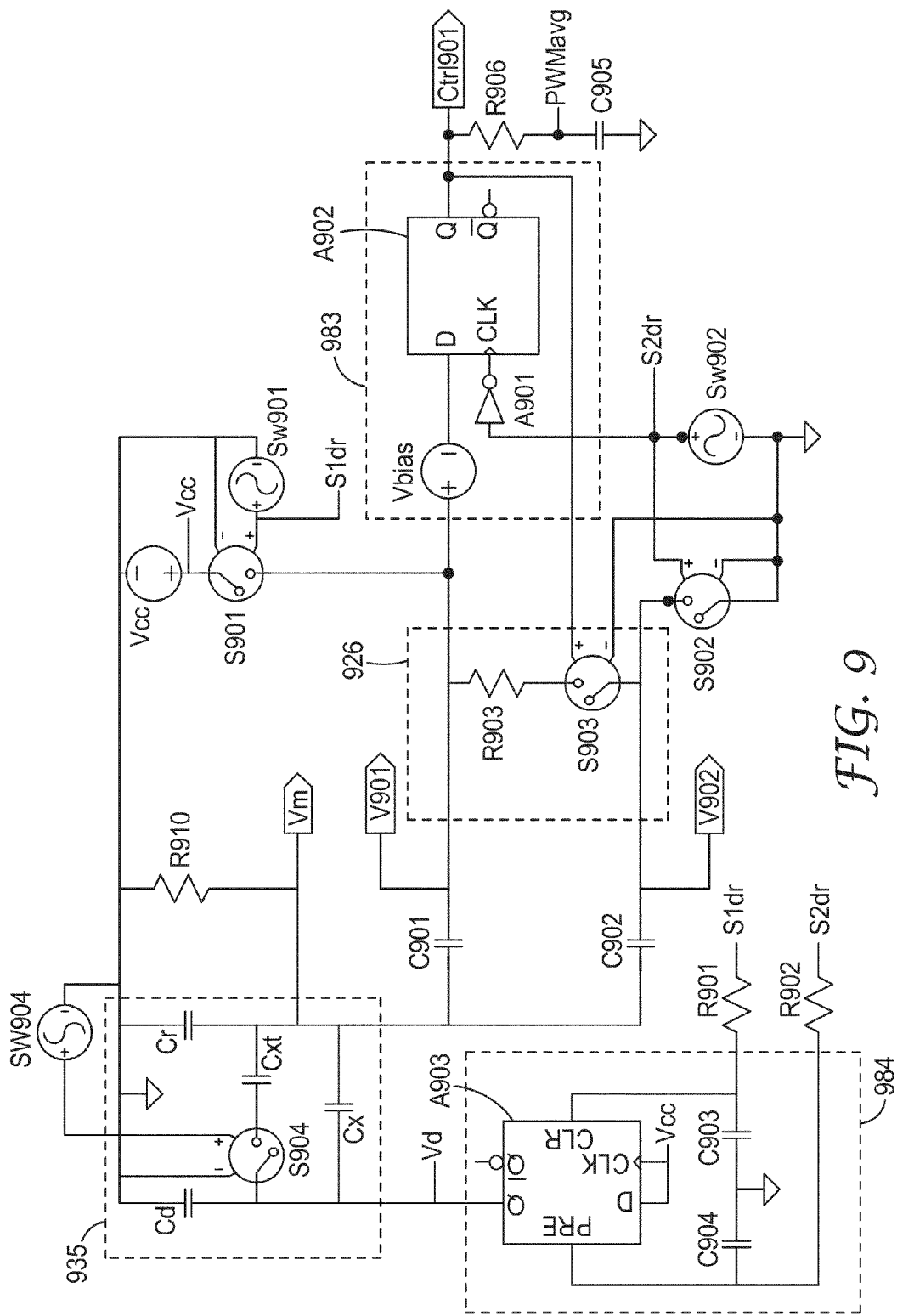
FIG. 9 is a schematic circuit diagram of a particular implementation of the circuit shown more generally in FIG. 8.

Turning now to FIG. 9, we see there a schematic circuit diagram of a particular implementation of the circuit shown more generally in FIG. 8. In FIG. 9, the system includes a sensor module 935 designed to mimic the attributes of an exemplary touch panel, a driver circuit 984, a variable current circuit 926, a control circuit 983, and various other components, many of which have substantial counterparts in FIGS. 3, 4, and 8. The system includes integrating capacitors C901, C902, which may correspond substantially to capacitors C301, C302 of FIG. 3, or C401, C402 of FIG. 4. The system of FIG. 9 also includes switches S901, S902, which may correspond substantially to switches S301, S302 of FIG. 3, or S401, S402 of FIG. 4. Discharge circuit (or variable current circuit) 926 may correspond substantially to circuit 326 of FIG. 3, and is similar to circuit 426 of FIG. 4. Control circuit 983 may correspond substantially to control circuit 350 of FIG. 3, or A402 of FIG. 4. Control line Ctrl901 may correspond substantially to control line Ctrl303 of FIG. 3.

Driver circuit 984 comprises a D-type flip-flop A903 which is set and cleared by drive signals S1dr and S2dr from switch control circuits Sw901 and Sw902 respectively. (The two lines labeled S1dr are assumed to be directly connected to each other, and the two lines labeled S2dr are assumed to be directly connected to each other.) The combinations of R901/C903 and R902/C904 delay the switching of A903 such that Vd (at the output Q of flip-flop A903) transitions from high (8V) to low (0 V) 200 nanoseconds after switch S901 is closed, and Vd transitions low to high 200 nanoseconds after switch S902 closes.

The sensor module 935, comprising capacitances Cd, Cr, and Cx, simulates a typical touch sensor. (Alternatively, Cd can represent the capacitance to ground of a stylus tip, where Cx is the coupling capacitance from the stylus tip to a sensor electrode, and Cr is the capacitance from the sensor electrode to ground.) Mutual capacitance Cx is simulated in two parts: Cx, which is constant, and Cxt, which can be alternately added to and removed from the circuit by operation of FET switch S904 (controlled by switch control circuit Sw904) to simulate a touch to the sensor, or the removal of the touch, respectively.

The variable current circuit 926 is simulated by a single resistor R903 in combination with a switch S903. The resistance range of circuit 926 can be varied from R903 to about infinity. Thus, the maximum discharge current achievable by circuit 926 is (V1−V2)/R3. If the load current (i.e., the current flowing from sensor module 935 to the node between capacitors C901, C902) exceeds (V901−V902)/R903, the switching frequency of S901 and S902 may be reduced to bring the load current to a level below (V901−V902)/R903.

Variable current circuit 926 is controlled by the pulse-width modulated (PWM) control signal Ctrl901. The control signal Ctrl901 is converted to a DC voltage by low-pass filter components C905 and R906, yielding the signal PWMavg, which is proportional to the duty cycle of Ctrl901, which is in turn proportional to the mutual capacitance Cx.

The control signal Ctrl901 is generated by measuring voltage V901, as described with respect to the measurement of voltage V801 of system 800 (FIG. 8). The signal Ctrl901 modulates variable current circuit 926 (elements S903 and R903) to maintain V901 at voltage Vcc. The voltage source Vbias at the D input of flip-flop A902 is used to translate from Vcc=5V to the switching threshold (2.5V) of the flip-flop A902.

The operation of the circuit of FIG. 9 was simulated using "LTspice IV" program referenced above. In the simulation, the following operating values and device types were assumed:
Cd: 10 picofarad
Cr: 10 picofarad
Cx: 0.8 picofarad
Cxt: 0.2 picofarad
C901: 2000 picofarad
C902: 2000 picofarad
C903: 30 picofarad
C904: 30 picofarad
C905: 1000 picofarad
R901: 10 kohm
R902: 10 kohm
R903: 1000 kohm
R906: 200 kohm
R910: 2 Megohm
Vcc: 5 volts
Vbias: 2.5 volts
S901: integrated circuit switch type 74AHCT367 (threshold voltage 1.5 volts, Ron=20 ohms)
S902: (same as S901)
S903: integrated circuit switch type 74HC4316 (threshold voltage 2.5 volts, Ron=50 ohms)
S904: FET switch (threshold voltage 2.5 volts, Ron=5 ohms)
A902: D-type Flip-Flop (threshold voltage for the D input is 2.5 volts)
A903: (same as A902)

The switch S904, the activation of which simulates the onset of a touch, was open from simulation time t=0 to t=2.5 milliseconds. At time t=2.5 milliseconds, switch S904 was opened to simulate a touch. The switches S901 and S902 were alternately closed for 1 microsecond and opened for 2 microseconds, so the switching period for these switches was 3 microseconds, yielding a base frequency of operation of 333 kHz.

Figure 10:
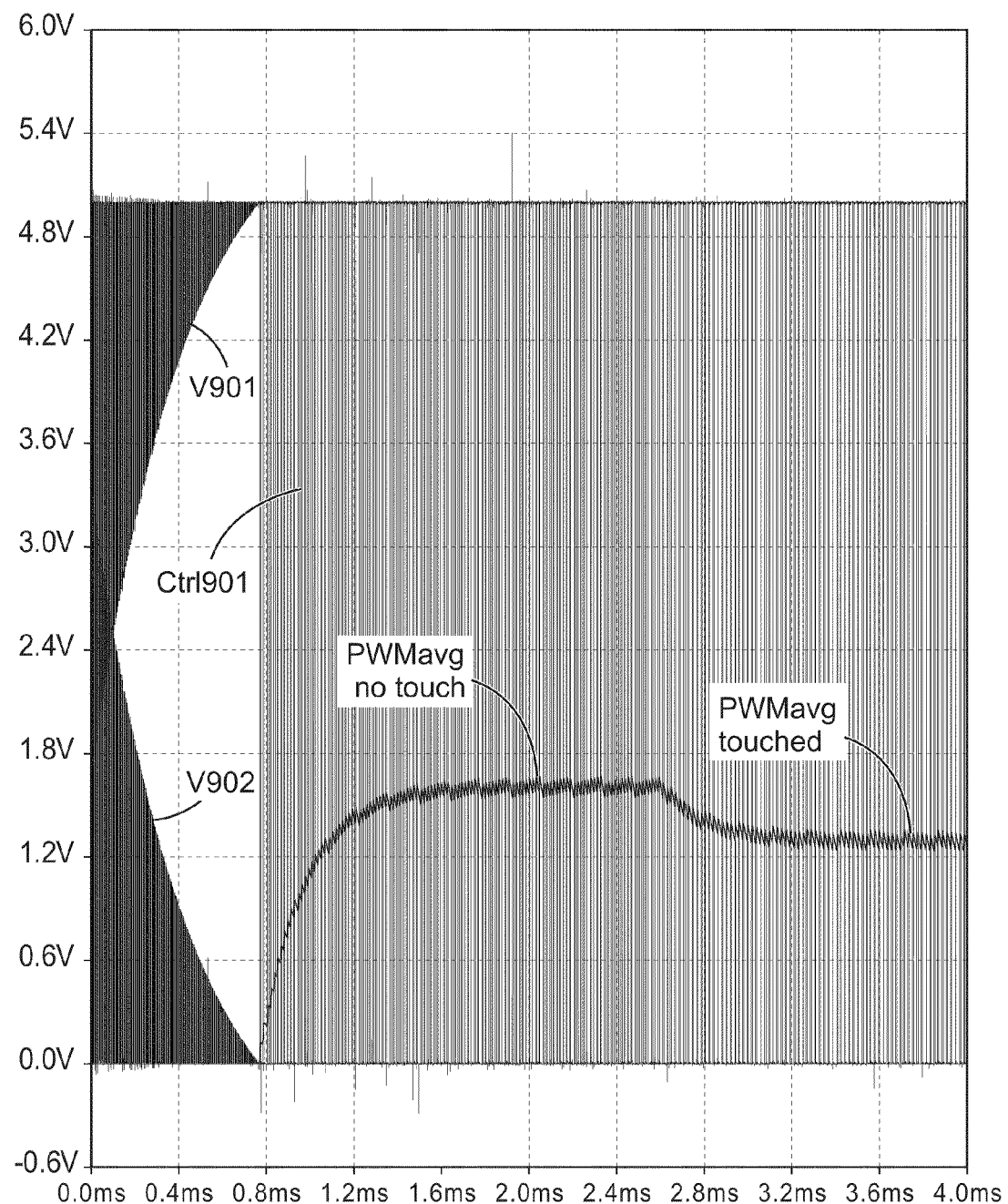
FIG. 10 is a voltage versus time graph showing the modeled response of the circuit of FIG. 9 when particular values are used for the circuit components.

Using the above operating values, the simulated waveforms for this circuit of FIG. 9 are provided in FIG. 10, where signals V901, V902, Ctrl901, and PWMavg are labeled. By inspection of the figure one can see that, after an initial transition, V901 and V902 are controlled to near-DC levels of Vcc and 0 V respectively by the PWM control signal Ctrl901. The signal PWMavg measures the duty cycle of the signal Ctrl901, which changes in response to a 20% reduction in Cx at time t=2.5 milliseconds.

Additional simulations were then made using the circuit of FIG. 9 as a starting point, but where different values of Cd, Cr, and Cx were assumed. The effect of these values on the parameter PWMavg are summarized below in Table 5.

The listed Simulations 1, 2, and 3 show that changing the value of Cr has a negligible effect on touch measurements. Simulations 4, 5, and 6 show that changing the value of Cd also has a negligible effect on touch measurements. Changes to Cx do result in proportional changes in the PWM control signal Ctrl901 and in the filtered DC level PWMavg, as indicated by Simulations 7-10.

Comparing the circuit of FIG. 9 with that of FIG. 8, one significant difference is that in the FIG. 9 circuit, V901 is regulated to a constant level near Vcc, and V902 is regulated to a constant level near 0 VDC, i.e., ground potential. Thus, the variable current circuit 926 of FIG. 9 is not modulated by an AC voltage, but is connected between near-Vcc and near-0V levels. Thus, it is possible in FIG. 9 to discharge C901 and C902 by connecting circuit 926 from V901 to ground, or to connect circuit 926 from V902 to Vcc. This may result in a cost reduction in circuit 926.

Figure 11:
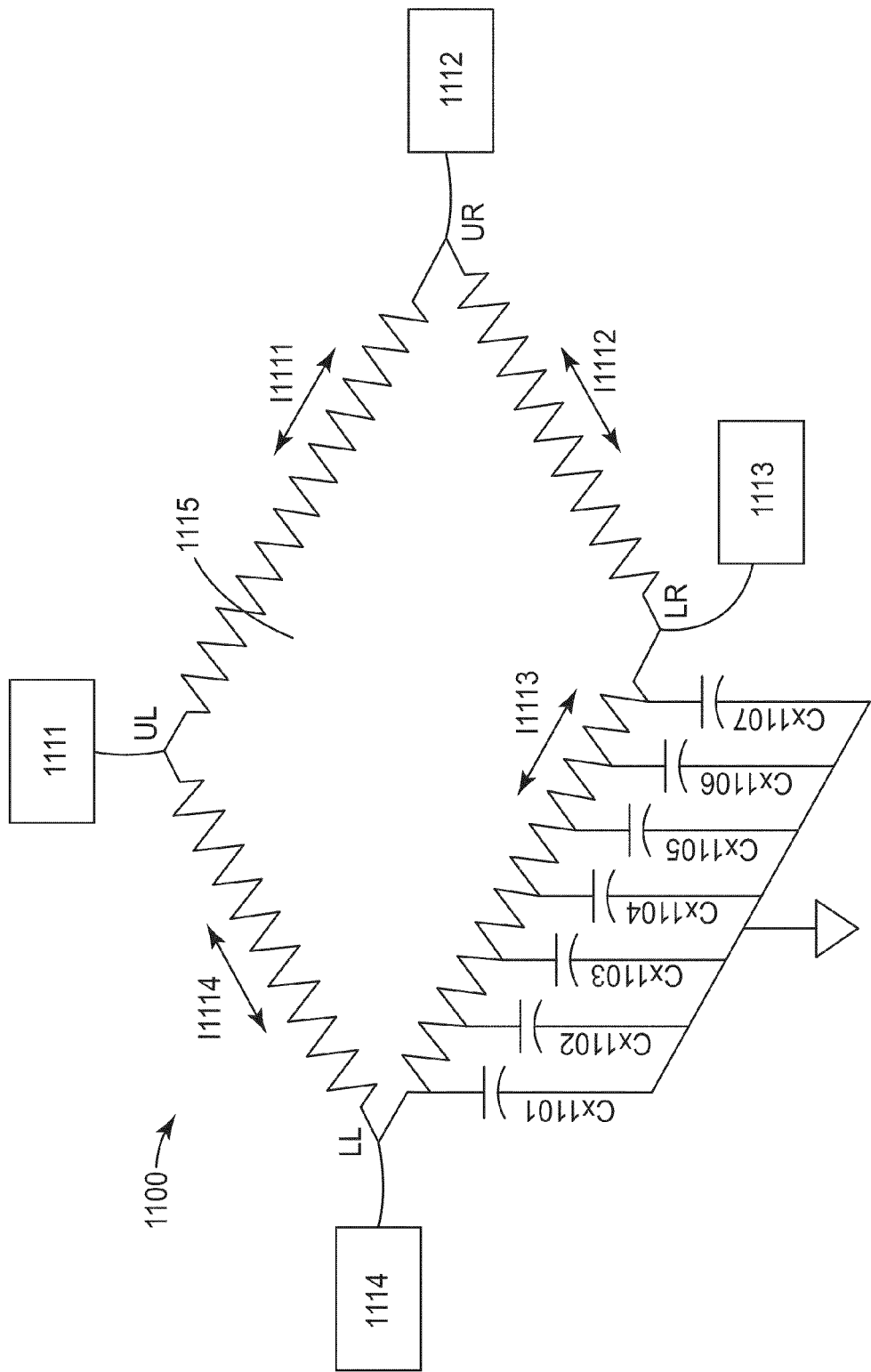
FIG. 11 is a schematic circuit diagram of a four-wire capacitive touch sensor including a capacitive sensing circuit for each of the four capacitive currents to be measured.

Multiple capacitive measurement circuits like those described above may be used advantageously in other touch-sensitive device applications. One such application is shown in FIG. 11, which provides a schematic circuit diagram of a system 1100 in which a four-wire surface capacitive touch sensor 1115 includes capacitive measurement circuits 1111, 1112, 1113, 1114 for each of four capacitive currents to be measured. One of the measurement circuits is coupled to each corner of the touch sensor, the corners labeled LL, UL, UR, and LR for lower left, upper left, upper right, and lower right, respectively. Each of the measurement circuits may have a design similar to those described above, and they may be operated in a coordinated or synchronized fashion. The surface capacitive sensor 1115 is modeled as four resistors as shown extending between the corners. This is a simplification of the actual circuit wherein the surface of sensor 1115 is a two-dimensional sheet resistor. The resistive surface of sensor 1115 also has capacitance to ground distributed approximately equally across its entire surface. The capacitors Cx1101 through Cx1107 represent a simplified model of this distributed capacitance along one side of the sensor 1115. Similar capacitance-to-ground along the other three edges and across the whole surface of sensor 1115 is present, but not shown in FIG. 11 for simplicity. U.S. Pat. No. 4,293,734 (Pepper, Jr.) provides additional information about surface capacitive sensors, and current ratio measurement techniques and circuits that can be used to convert the raw measurements to touch location information.

Figure 12:
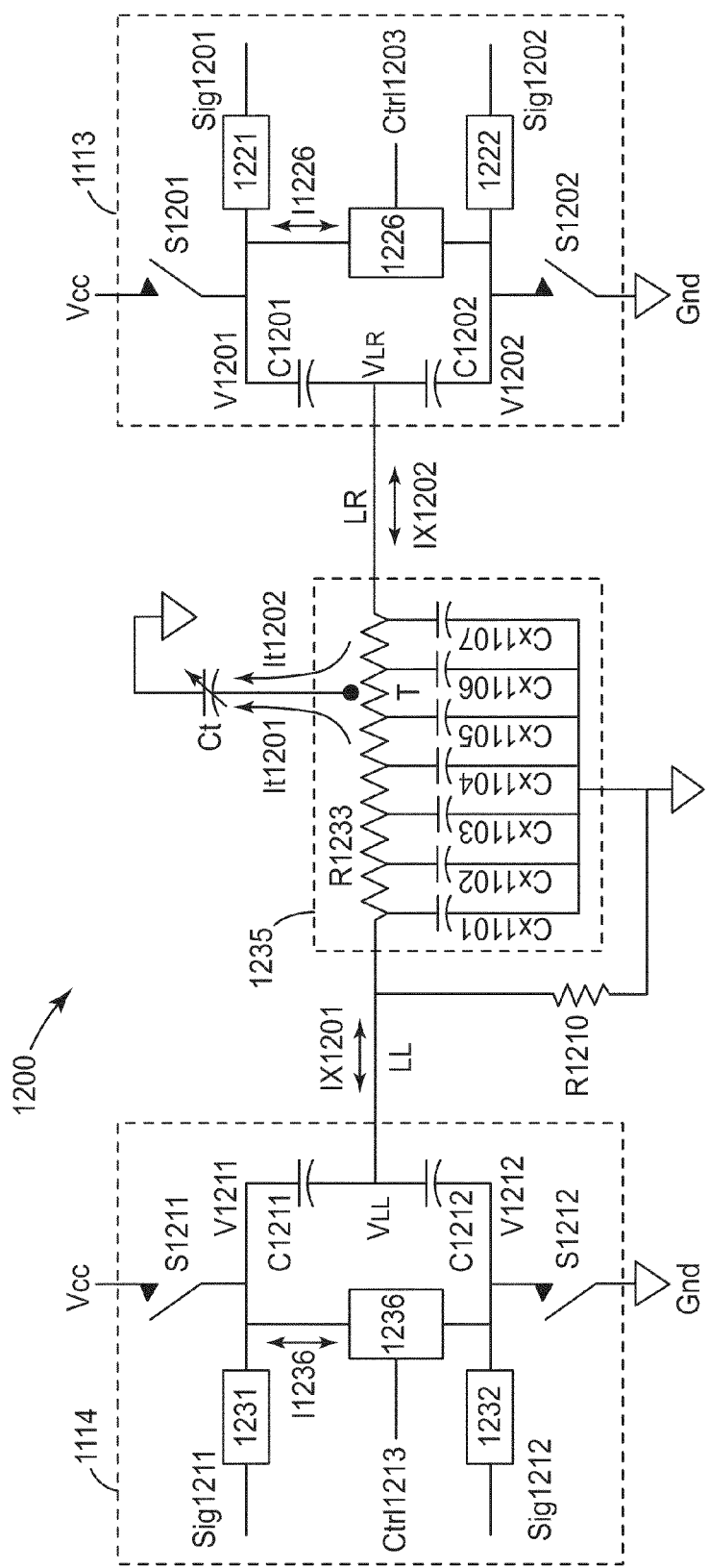
FIG. 12 is a schematic circuit diagram similar to that of FIG. 11 but where only a portion of the overall circuit is shown, and where more detail is provided in connection with the capacitive current measurement circuits.

FIG. 12 is a schematic circuit diagram of system 1200 employing a surface capacitive touch sensor similar to that of FIG. 11, but where only a portion of the overall circuit is shown, and where more detail is provided in connection with

TABLE 5

Alternative Simulations with the FIG. 9 Circuit

| Simulation | Cd (pf) | Cr (pf) | Cx (no touch) (pf) | Cx (touched) (pf) | % change in Cx | PWMavg no touch | PWMavg touched | % change in PWMavg |
|---|---|---|---|---|---|---|---|---|
| 1 | 10 | 10 | 1 | 0.8 | 20% | 1.60 | 1.29 | 19% |
| 2 | 10 | 20 | 1 | 0.8 | 20% | 1.61 | 1.30 | 19% |
| 3 | 10 | 30 | 1 | 0.8 | 20% | 1.62 | 1.30 | 20% |
| 4 | 10 | 5 | 1 | 0.8 | 20% | 1.60 | 1.29 | 19% |
| 5 | 20 | 10 | 1 | 0.8 | 20% | 1.60 | 1.29 | 19% |
| 6 | 30 | 10 | 1 | 0.8 | 20% | 1.60 | 1.29 | 19% |
| 7 | 10 | 10 | 0.5 | 0.4 | 20% | 0.82 | 0.66 | 19% |
| 8 | 10 | 10 | 0.9 | 0.8 | 11% | 1.45 | 1.29 | 11% |
| 9 | 10 | 10 | 1.1 | 1 | 9% | 1.76 | 1.60 | 9% |
| 10 | 10 | 10 | 1.2 | 1 | 17% | 1.92 | 1.60 | 17% | the capacitance measurement circuits. In particular, measurement circuits 1113 and 1114 from FIG. 11 are shown in FIG. 12. Between these circuits a portion of surface capacitive sensor 1115, referred to here as a sensor portion 1235, is shown. The sensor portion 1235, in simplified fashion, is assumed to have a resistance R1233 and distributed capacitors Cx1101 through Cx1107, as in FIG. 11. For purposes of this discussion, R1233 is assumed to have equal resistance along its full length, and distributed capacitances Cx1101 through Cx1107 are all equal.

System 1200 is preferably operated so as to drive the sensor portion 1235 with equal and in-phase AC voltages $V_{LL}$ and $V_{LR}$, and to measure the resulting currents Ix1201 and Ix1202. In the absence of a touch to sensor 1235, Ix1201 and Ix1202 are approximately equal. A touch to sensor 1235 adds incremental capacitance-to-ground Ct at point T, i.e., the touch point. This also causes incremental currents It1201 and It1202 to flow through Ct, with It1201 flowing into measurement circuit 1114 and It1202 flowing into measurement circuit 1113, in proportion to the relative distance of point T from the LL corner point versus the LR corner point. The ratio of the incremental currents It1201 to It1202 can be used to measure the location of touch point T on sensor 1235, using calculations described in the Pepper, Jr. '734 patent referenced above.

Essentially, each of the capacitive measurement circuits 1113 and 1114 (as well as measurement circuits 1111 and 1112 in FIG. 11) is operated to measure the capacitive current associated with its respective node LR, LL, respectively, such that the circuits measure the effective capacitance (referred to elsewhere herein as an unknown capacitance) of the surface capacitive sensor 1115 from the perspective of their respective nodes or measurement points LR, LL respectively. Then, the different capacitive measurements obtained from the different circuits 1113, 1114 (as well as 1111 and 1112) can be numerically manipulated, e.g. by calculating suitable ratios as outlined in the Pepper, Jr. '734 patent, to determine the position coordinates of the touch point.

Each of the circuits 1111, 1112, 1113, 1114 may thus be of the same or similar design as the capacitive measurement circuits already described above, see e.g. FIGS. 3 and 4 and the associated descriptions, such circuits desirably including the feedback mechanism in which the charging current and discharging current on the integrating capacitors (accumulators) are dynamically balanced.

Thus, for example, switches S1201 and S1202 may correspond substantially to switches S301 and S302, respectively, of FIG. 3. Integrating capacitors or accumulators C1201 and C1202 may correspond substantially to capacitors C301 and C302, respectively, of FIG. 3. Measurement circuits 1221 and 1222 may correspond substantially to circuits 321 and 322, respectively, of FIG. 3. Discharge circuit 1226 (which may be or comprise a variable current circuit) may correspond substantially to circuit 326 of FIG. 3. The control line Ctrl1203 may correspond substantially to control line Ctrl303 of FIG. 3, and additional control lines analogous to control lines Ctrl301 and Ctrl302, as well as a control circuit analogous to control circuit 350, are preferably also included in the circuit 1113. The currents I1226 and Ix1202 may correspond substantially to currents I326 and Ix, respectively, in FIG. 3.

Similarly, switches S1211 and S1212 of measurement circuit 1114 may correspond substantially to switches S301 and S302, respectively, of FIG. 3. Integrating capacitors or accumulators C1211 and C1212 may correspond substantially to capacitors C301 and C302, respectively, of FIG. 3. Measurement circuits 1231 and 1232 may correspond substantially to circuits 321 and 322, respectively, of FIG. 3. Discharge circuit 1236 (which may be or comprise a variable current circuit) may correspond substantially to circuit 326 of FIG. 3. The control line Ctrl1213 may correspond substantially to control line Ctrl303 of FIG. 3, and additional control lines analogous to control lines Ctrl301 and Ctrl302, as well as a control circuit analogous to control circuit 350, are preferably also included in the circuit 1114. The currents I1236 and Ix1201 may correspond substantially to currents I326 and Ix, respectively, in FIG. 3.

With this background, the reader will readily understand the operation of the system 1200, keeping in mind the desirability (but not the necessity) of coordinating or synchronizing the operation of the various measurement circuits. For clarity, we describe below in Table 6 a possible sequence of operation of the system 1200, involving the two measurement circuits 1113 and 1114, which is analogous to the sequence set forth in Table 3 above for a single measurement circuit.

TABLE 6

Sequence with Feedback (Dual Circuit)

| | Step 1 | Step 2 | Step 3 | Step 4 | Step 5 | Step 6 | Step 7 |
|---|---|---|---|---|---|---|---|
| Function | Reset | $V_{LR}$ up | Test V1202 | Float 1 | $V_{LR}$ down | Test V1201 | Float 2 |
| S1201 | open | closes | closed | opens | open | open | open |
| S1211 | open | closes | closed | opens | open | open | open |
| S1202 | open | open | open | open | closes | closed | opens |
| S1212 | open | open | open | open | closes | closed | opens |
| Circuit 1113 | I1226 = preset current | | Is V1202 below threshold Vth1222? | If V1202 < Vth1222, increase I1226, else maintain I1226 | | Is V1201 below threshold Vth1221? | If V1201 > Vth1221, increase I1226, else maintain I1226 |
| Circuit 1114 | I1236 = preset current | | Is V1212 below threshold Vth1232? | If V1212 < Vth1232, increase I1236, else maintain I1236 | | Is V1211 below threshold Vth1231? | If V1211 > Vth1231, increase I1236, else maintain I1236 |

Note that Vth1221 is the voltage threshold of circuit 1221, and Vth1222 is the voltage threshold for circuit 1222, and Vth1231 is the voltage threshold of circuit 1231, and Vth1232 is the voltage threshold for circuit 1232. The current I1226 can be controlled by testing V1202 or by testing V1201 or by testing any combination thereof (for example, both V1201 and V1202, or the voltage difference between V1201 and V1202). Similarly, the current I1236 can be controlled by testing V1212 or by testing V1211 or by testing any combination thereof (for example, both V1211 and V1212, or the voltage difference between V1211 and V1212).

The comments above with respect to Steps 1 through 7 of Table 3 apply equally, in an analogous fashion, to the steps of this Table 6. The end result is that the feedback mechanisms provided by control signals Ctrl1203 and Ctrl1213 in circuits 1113 and 1114, respectively, balance the charging current and the discharging current on the respective integrating capacitors (accumulators). The duty cycle, frequency, or other relevant operating characteristic of the respective control signal can then be used, for each measurement circuit, as measure of the unknown capacitance with respect to its measurement point.

The reader will keep in mind that numerous variations can be made with respect to the measurement circuits, devices, systems, and methods disclosed herein, and all such variations are considered to be encompassed by this disclosure. In one variation, a given measurement circuit may be modified to have only one integrating capacitor (accumulator) rather than a pair of such elements. For example, either one of the capacitors C301 or C302 (FIG. 3), or either one of capacitors C401 or C402 (FIG. 4), or either one of capacitors C801 or C802 (FIG. 8), or either one of capacitors C901 or C902 (FIG. 9), or either one of capacitors C1201 or C1202 (FIG. 12), or either one of capacitors C1211 or C1212 (FIG. 12), may be eliminated and replaced with a short-circuit connection. The resulting unipolar measurements, which may be more subject to low frequency noise than the bipolar measurements made using both capacitors, are usually less desirable than the bipolar counterpart, but cost considerations or other design tradeoffs may render the unipolar designs desirable in some applications. In the resulting unipolar embodiments, the feedback control signal is used to balance the charging current and discharging current for only the single integrating capacitor.

Related to the unipolar variation are variations in which the switch-controlled charging or discharging cycles utilize only one switch, rather than a plurality of switches (e.g. two switches) as shown in most of the circuit diagrams. Thus, for example, if capacitor C301 is removed from the circuit of FIG. 3, then switch S301 (and control line Ctrl301) may also be omitted. Similarly, if capacitor C302 is removed from the circuit of FIG. 3, then switch S302 (and control line Ctrl302) may also be omitted.

In other variations, the control signals of the measurement circuit can be selected such that either one or both of the control signals, one of which controls the charging of the accumulator(s) via the switch-controlled charging or discharging cycles, and the other of which controls the discharging of the accumulator(s) via the variable current circuit, may be dynamically adjusted to achieve the desired balance. In many of the above-described embodiments, the switch-controlled charging or discharging cycles (which function to charge the accumulator(s)) are operated under fixed operating conditions (e.g., fixed frequency and pulse width or duty cycle) and the discharging of the accumulator(s) is dynamically adjusted by dynamically adjusting the variable current device. In alternative embodiments, the discharging of the accumulator(s) may be operated under fixed operating conditions (e.g., fixed frequency and pulse width or duty cycle) and the feedback may be provided by dynamic adjustment of the charging of the accumulator(s), e.g., by dynamic adjustment of the frequency, pulse width, duty cycle, and/or other relevant parameter of the switch-controlled charging or discharging cycles. In these embodiments, a variable current circuit or device may not be needed, and may be omitted from the described circuits. (For example, control line Ctrl303 of FIG. 3 may be omitted, and the circuit 326 may be replaced with a constant current circuit or device, or a constant impedance circuit or device, for example.) In still other alternative embodiments, both the charging of the accumulator(s), e.g. via dynamic adjustment of the switch-controlled charging or discharging cycles, and the discharging of the accumulator(s), via dynamic adjustment of a variable current circuit or device, may be dynamically adjusted, and the combination of the adjusted control signals can be used as a measure of the unknown capacitance.

Unless otherwise indicated, all numbers expressing quantities, measurement of properties, and so forth used in the specification and claims are to be understood as being modified by the term "about". Accordingly, unless indicated to the contrary, the numerical parameters set forth in the specification and claims are approximations that can vary depending on the desired properties sought to be obtained by those skilled in the art utilizing the teachings of the present application. Not as an attempt to limit the application of the doctrine of equivalents to the scope of the claims, each numerical parameter should at least be construed in light of the number of reported significant digits and by applying ordinary rounding techniques. Notwithstanding that the numerical ranges and parameters setting forth the broad scope of the invention are approximations, to the extent any numerical values are set forth in specific examples described herein, they are reported as precisely as reasonably possible. Any numerical value, however, may well contain errors associated with testing or measurement limitations.

Various modifications and alterations of this invention will be apparent to those skilled in the art without departing from the spirit and scope of this invention, and it should be understood that this invention is not limited to the illustrative embodiments set forth herein. For example, the reader should assume that features of one disclosed embodiment can also be applied to all other disclosed embodiments unless otherwise indicated. It should also be understood that all U.S. patents, patent application publications, and other patent and non-patent documents referred to herein are incorporated by reference, to the extent they do not contradict the foregoing disclosure.

The invention claimed is:

1. A method of measuring a capacitance, comprising:
building up charge on a first accumulator over a plurality of switch-controlled charging or discharging cycles governed by a first control signal;
partially discharging the first accumulator as a function of a second control signal, optionally using a variable current device;
monitoring an accumulator signal that is based on the charge on the first accumulator;
dynamically adjusting one of the first and second control signals so as to keep the accumulator signal in a desired range; and
using the dynamically adjusted control signal as a measure of the capacitance.

2. The method of claim 1, wherein the charge is built up on the first accumulator over a plurality of switch-controlled charging cycles, the method further comprising:
building up charge on a second accumulator over a plurality of switch-controlled discharging cycles; and
partially discharging the second accumulator as a function of the second control signal, using the variable current device;

wherein the accumulator signal is based on the charge on the first accumulator and the charge on the second accumulator.

3. The method of claim 1, wherein the first control signal is maintained at a constant frequency and the second control signal is dynamically adjusted.

4. The method of claim 1, wherein the second control signal is maintained at a constant frequency and the first control signal is dynamically adjusted.

5. The method of claim 1, wherein the variable current device comprises at least one passive circuit component and at least one switch, and the second control signal modulates the switch to carry out the partial discharging.

6. The method of claim 5, wherein the switch-controlled charging or discharging cycles are asynchronous with respect to the second control signal modulation.

7. The method of claim 5, wherein the second control signal modulates the switch between a plurality of switch states, one of the switch states corresponding to an open circuit between terminals of the variable current device.

8. The method of claim 1, wherein the variable current device comprises at least a first and second passive circuit component and at least one switch, and the second control signal controls the switch between a first state, in which at least the first passive circuit component passes electrical current associated with the partial discharging, and a second state, in which at least the second passive circuit component passes electrical current associated with the partial discharging, and wherein the first passive circuit component does not pass any electrical current associated with the partial discharging in the second state.

9. The method of claim 2, wherein each charging cycle of the plurality of switch-controlled charging cycles comprises a first charging interval and a first holding interval, and each charging cycle of the plurality of switch-controlled discharging cycles comprises a second charging interval and a second holding interval, and the first holding interval occurs during the second charging interval, and the second holding interval occurs during the first charging interval.

10. The method of claim 1, wherein the dynamic adjusting comprises pulse width modulating the first or second control signal, and wherein the pulse width is used as a measure of the capacitance.

11. The method of claim 1, wherein the capacitance is a first capacitance associated with a touch and a first node of a touch panel, the touch also being associated with a second capacitance at a second node of the touch panel, the method further comprising:
measuring the second capacitance; and
determining a location of the touch on the touch panel based on the measured first capacitance and the measured second capacitance.

12. A device for measuring a capacitance, comprising:
an accumulator circuit coupleable to the capacitance and comprising a first accumulator and one or more switches configured to build up charge on the first accumulator over a plurality of switch-controlled charging or discharging cycles governed by a first control signal coupled to the one or more switches, the accumulator circuit adapted to provide an accumulator signal based on the charge on the first accumulator;
a discharge circuit coupled to the accumulator circuit and optionally comprising a variable current device, the discharge circuit being adapted to partially discharge the first accumulator as a function of a second control signal; and a control circuit coupled to the accumulator circuit and the discharge circuit, the control circuit being adapted to dynamically adjust one of the first and second control signals so as to keep the accumulator signal in a desired range;
wherein the device uses the dynamically adjusted control signal as a measure of the capacitance.

13. The device of claim 12, wherein the accumulator circuit further comprises a second accumulator, wherein the one or more switches are configured to build up charge on the first accumulator over a plurality of switch-controlled charging cycles and configured to build up charge on the second accumulator over a plurality of switch-controlled discharging cycles, and wherein the discharge circuit is further configured to partially discharge the second accumulator as a function of the second control signal.

14. The device of claim 13, wherein the accumulator signal is based on the charge on the first accumulator and the charge on the second accumulator.

15. The device of claim 12, wherein the control circuit is adapted to maintain the first control signal at a constant frequency and is adapted to dynamically adjust the second control signal.

16. The device of claim 12, wherein the control circuit is adapted to maintain the second control signal at a constant frequency and is adapted to dynamically adjust the first control signal.

17. The device of claim 12, wherein the variable current device comprises a first passive circuit component and a first switch, and the first switch is configured to respond to the second control signal to carry out the partial discharging.

18. The device of claim 17, wherein the first switch is modulated by the second control signal between a plurality of switch states, one of the switch states corresponding to an open circuit between terminals of the variable current device.

19. The device of claim 12, wherein the variable current device includes a first and second passive circuit component and a first switch, and the second control signal is adapted to control the first switch between a first state, in which at least the first passive circuit component passes electrical current associated with the partial discharging, and a second state, in which at least the second passive circuit component passes electrical current associated with the partial discharging, and wherein the first passive circuit component does not pass any electrical current associated with the partial discharging in the second state.

20. The device of claim 12, wherein the control circuit is adapted to dynamic adjust one of the first and second control signals using pulse width modulation.

21. A capacitive touch panel device comprising the device of claim 12.

22. The device of claim 12, wherein the accumulator circuit is directly coupled to the capacitance.

23. A method of measuring a capacitance, comprising:
building up charge on a first accumulator over a plurality of switch-controlled charging or discharging cycles governed by a first control signal;
partially discharging the first accumulator during the plurality of switch-controlled charging or discharging cycles;
monitoring an accumulator signal that is based on the charge on the first accumulator;
dynamically adjusting the first control signal so as to keep the accumulator signal in a desired range; and
using the dynamically adjusted control signal as a measure of the capacitance.

24. A device for measuring a capacitance, comprising:
an accumulator circuit coupleable to the capacitance and comprising a first accumulator and one or more switches configured to build up charge on the first accumulator over a plurality of switch-controlled charging or discharging cycles governed by a first control signal coupled to the one or more switches, the accumulator circuit adapted to provide an accumulator signal based on the charge on the first accumulator;
a discharge circuit coupled to the accumulator circuit, the discharge circuit being adapted to partially discharge the first accumulator during the plurality of switch-controlled charging or discharging cycles; and
a control circuit coupled to the accumulator circuit, the control circuit being adapted to dynamically adjust the first control signal so as to keep the accumulator signal in a desired range;
wherein the device uses the dynamically adjusted control signal as a measure of the capacitance.

* * * * *

UNITED STATES PATENT AND TRADEMARK OFFICE
CERTIFICATE OF CORRECTION

PATENT NO. : 8,174,273 B2
APPLICATION NO. : 12/683700
DATED : May 8, 2012
INVENTOR(S) : Bernard Geaghan Page 1 of 1

It is certified that error appears in the above-identified patent and that said Letters Patent is hereby corrected as shown below:

Column 8
Table 3, Step 3, delete "theshold" and insert -- threshold -- therefor.

Signed and Sealed this
Thirty-first Day of July, 2012

David J. Kappos
*Director of the United States Patent and Trademark Office*